United States Patent
Zhang et al.

(10) Patent No.: US 12,119,694 B2
(45) Date of Patent: Oct. 15, 2024

(54) BATTERY CAPACITY TRACKING METHOD AND APPARATUS, AND ELECTRONIC DEVICE

(71) Applicant: HUAWEI TECHNOLOGIES CO., LTD., Guangdong (CN)

(72) Inventors: Mingwei Zhang, Shenzhen (CN); Ruichao Tang, Shenzhen (CN); Yao Yuan, Shanghai (CN); Lihou Ma, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 366 days.

(21) Appl. No.: 17/724,923

(22) Filed: Apr. 20, 2022

(65) Prior Publication Data

US 2022/0255333 A1    Aug. 11, 2022

Related U.S. Application Data

(63) Continuation of application No. PCT/CN2020/103652, filed on Jul. 23, 2020.

(30) Foreign Application Priority Data

Oct. 22, 2019 (CN) .......... 201911007915.4

(51) Int. Cl.
  *G01R 31/374* (2019.01)
  *G01R 31/3835* (2019.01)
  *H02J 7/00* (2006.01)

(52) U.S. Cl.
  CPC .......... *H02J 7/0049* (2020.01); *G01R 31/374* (2019.01); *G01R 31/3835* (2019.01); *H02J 7/0013* (2013.01)

(58) Field of Classification Search
  CPC .. H02J 7/0049; H02J 7/0013; G01R 31/3835; G01R 31/374
  See application file for complete search history.

(56) References Cited

U.S. PATENT DOCUMENTS 4,560,937 A * 12/1985 Finger ................ G01R 31/3648
                                                      324/435
2010/0201318 A1    8/2010 Sugiyama et al.
(Continued)

FOREIGN PATENT DOCUMENTS

| CH | 662448 A5 | 9/1987 |
|----|-----------|--------|
| CN | 1285642 A | 2/2001 |

(Continued)

OTHER PUBLICATIONS

Bai Yao, State Detection System of Lithium Battery Pack Based on FPGA, Shanghai Normal University, 2015, Issue 11, 2 pages (abstract).

(Continued)

*Primary Examiner* — Jermele M Hollington
*Assistant Examiner* — Taqi R Nasir
(74) *Attorney, Agent, or Firm* — WOMBLE BOND DICKINSON (US) LLP

(57) ABSTRACT

A battery capacity tracking method and apparatus, and a device are provided. For two batteries connected in series, a first remaining capacity change value corresponding to a first battery when the first battery is switched between a fully charged state and a fully discharged state is obtained; a second remaining capacity change value corresponding to the second battery when the second battery is switched between a fully charged state and a fully discharged state is obtained; and after a remaining capacity change value corresponding to a battery when the battery is switched from one state to another state is obtained, a full charge capacity of the first battery is determined based on the first remaining (Continued)

capacity change value, the second remaining capacity change value, and a full charge capacity of the second battery.

20 Claims, 6 Drawing Sheets

(56) References Cited

U.S. PATENT DOCUMENTS

| | | | |
|---|---|---|---|
| 2010/0225325 A1* | 9/2010 | Christensen | G01R 31/3842 324/426 |
| 2014/0184236 A1 | 7/2014 | Ohkawa et al. | |
| 2015/0346285 A1 | 12/2015 | Igarashi et al. | |
| 2017/0110725 A1* | 4/2017 | Sakamoto | H01M 4/505 |
| 2019/0219639 A1 | 7/2019 | Kawabe | |

FOREIGN PATENT DOCUMENTS

| | | |
|---|---|---|
| CN | 101303397 A | 11/2008 |
| CN | 102306943 A | 1/2012 |
| CN | 102347627 A | 2/2012 |
| CN | 102472802 A | 5/2012 |
| CN | 102820442 A | 12/2012 |
| CN | 102891506 A | 1/2013 |
| CN | 102969772 A | 3/2013 |
| CN | 203337798 U | 12/2013 |
| CN | 103852725 A | 6/2014 |
| CN | 104364116 A | 2/2015 |
| CN | 104698385 A | 6/2015 |
| CN | 104813560 A | 7/2015 |
| CN | 105027382 A | 11/2015 |
| CN | 105098729 A | 11/2015 |
| CN | 106471386 A | 3/2017 |
| CN | 107769328 A | 3/2018 |
| CN | 107852013 A | 3/2018 |
| IN | 204389654 U | 6/2015 |
| JP | H10293164 A | 11/1998 |
| JP | 2010203854 A | 9/2010 |
| JP | 2013253857 A | 12/2013 |
| JP | 2017204485 A | 11/2017 |

OTHER PUBLICATIONS

Zhang Yong-kai et al, Lithium Battery Detection Based on Coulometer, Control and Instruments in Chemical Industry , 2016, Issue 02, 4 pages.

Becherif, M. et al, Enhancement of the Coulomb Counter Estimator by the on-board Vehicle Determination of Battery Initial State of Charge, IFAC Proceedings vols. 2012 vol. 45; Iss. 21, 6 pages.

Yuejiu Zheng et al, A novel capacity estimation method based on charging curve sections for lithium-ion batteries in electric vehicles, Energy 185 (2019) 361 371, Jul. 2019, 11 pages.

* cited by examiner

BATTERY CAPACITY TRACKING METHOD AND APPARATUS, AND ELECTRONIC DEVICE

CROSS-REFERENCE TO RELATED APPLICATIONS

This application is a continuation of International Application No. PCT/CN2020/103652, filed on Jul. 23, 2020, which claims priority to Chinese Patent Application No. 201911007915.4, filed on Oct. 22, 2019. The disclosures of the aforementioned applications are hereby incorporated by reference in their entireties.

TECHNICAL FIELD

This application relates to the field of battery technologies, and in particular, to a battery capacity tracking method and apparatus, and an electronic device.

BACKGROUND

As an electronic device imposes an increasingly high requirement for a battery capacity, a battery system is prompted to change from a single-battery structure (as shown in FIG. 1) to a multi-battery structure, to supply power to the electronic device by using a plurality of batteries, and meet a power requirement.

However, in an existing battery capacity tracking method, a battery level management chip (a coulomb counter) is mainly used to perform statistical management on a parameter of a single battery. As shown in FIG. 1, the coulomb counter is used to collect parameters such as a remaining capacity and a full charge capacity of the battery, and a battery level of another battery in the multi-battery structure cannot be monitored. In this case, to obtain a full charge capacity and a remaining capacity of each battery, a coulomb counter may be configured for each battery. However, for an electronic device with a small volume, for example, a mobile phone, this operation leads to not only an increase in a volume of the electronic device, but also an increase in production costs. Therefore, how to track capacities of a plurality of batteries by using a single battery level management chip is an urgent problem to be resolved.

SUMMARY

In view of this, embodiments of this application provide a battery capacity tracking method and apparatus, and an electronic device, to track a capacity of each battery without increasing a volume of the electronic device or production costs.

To resolve the foregoing problem, the embodiments of this application provide the following technical solutions.

According to a first aspect, a battery capacity tracking method is provided. The method is applied to an electronic device, the electronic device includes a coulomb counter chip, and a first battery and a second battery that are connected in series, the coulomb counter chip is connected to two ends of the second battery in parallel, and the method includes: obtaining a first remaining capacity change value corresponding to the first battery when the first battery is switched between a fully charged state and a fully discharged state; obtaining a second remaining capacity change value corresponding to the second battery when the second battery is switched between a fully charged state and a fully discharged state; and determining a full charge capacity of the first battery based on the first remaining capacity change value, the second remaining capacity change value, and a full charge capacity of the second battery, where the full charge capacity of the second battery is directly obtained by using the coulomb counter chip.

In an embodiment, because the coulomb counter chip is connected to the two ends of the second battery in parallel, the full charge capacity of the second battery may be directly obtained. In addition, a remaining capacity of the second battery in the fully charged state and a remaining capacity of the second battery is in the fully discharged state may also be directly obtained by using the coulomb counter chip. Therefore, the second remaining capacity change value corresponding to the second battery when the second battery is switched between the fully charged state and the fully discharged state may be obtained. In addition, a same quantity of charges flow through the two batteries regardless of whether there is a discharging process or a charging process. Therefore, the full charge capacity of the first battery may be determined based on the first remaining capacity change value corresponding to the first battery when the first battery is switched between the fully charged state and the fully discharged state, the second remaining capacity change value corresponding to the second battery when the second battery is switched between the fully charged state and the fully discharged state, and the full charge capacity of the second battery. In other words, the full charge capacities of the two batteries are obtained by using a single coulomb counter chip, to effectively monitor the two batteries connected in series.

In an embodiment, the determining a full charge capacity of the first battery based on the first remaining capacity change value, the second remaining capacity change value, and a full charge capacity of the second battery includes: obtaining the full charge capacity of the first battery by dividing a product of the full charge capacity of the second battery and the second remaining capacity change value by the first remaining capacity change value. Specifically, refer to the following formula:

$$FCC1 = \frac{FCC2 * \Delta SOC2}{\Delta SOC1}$$

FCC1 is the full charge capacity of the first battery, FCC2 is the full charge capacity of the second battery, $\Delta SOC2 = SOC2\_start - SOC2\_end$ is the second remaining capacity change value, and $\Delta SOC1 = SOC1\_start - SOC1\_end$ is the first remaining capacity change value. The discharging process is used as an example. SOC2_start is a remaining capacity corresponding to the second battery in the fully charged state, SOC2_end is a remaining capacity corresponding to the second battery in the fully discharged state, SOC1_start is a remaining capacity corresponding to the first battery in the fully charged state, and SOC1_end is a remaining capacity corresponding to the first battery in the fully discharged state. The charging process is used as an example. SOC2_start is a remaining capacity corresponding to the second battery in the fully discharged state, SOC2_end is a remaining capacity corresponding to the second battery in the fully charged state, SOC1_start is a remaining capacity corresponding to the first battery in the fully discharged state, and SOC1_end is a remaining capacity corresponding to the first battery in the fully charged state. The foregoing equation is true because regardless of whether the two batteries connected in series are in a charged state or a discharged state, a same current flows through the two batteries, and there is same current duration. Therefore, an equal quantity of charges flow through the two batteries.

In an embodiment, during switching from the fully discharged state to the fully charged state, the obtaining the full charge capacity of the first battery by dividing a product of the full charge capacity of the second battery and the second remaining capacity change value by the first remaining capacity change value includes: determining a first additional capacity correspondingly consumed when a first switch is in a closed state in a charging process, where the first switch is connected to two ends of the first battery in parallel; determining a second additional capacity correspondingly consumed when a second switch is in a closed state in the charging process, where the second switch is connected to the two ends of the second battery in parallel; and obtaining the full charge capacity of the first battery by dividing, by the first remaining capacity change value, a difference obtained by subtracting the first additional capacity from a sum of the second additional capacity and the product of the full charge capacity of the second battery and the second remaining capacity change value. For a specific implementation, refer to the following formula:

$$FCC1*\Delta SOC1+\Delta CC1=FCC2*\Delta SOC2+\Delta CC2$$

$$FCC1 = \frac{FCC2*\Delta SOC2 + \Delta CC2 - \Delta CC1}{\Delta SOC1}$$

FCC1 is the full charge capacity of the first battery, FCC2 is the full charge capacity of the second battery, $\Delta SOC2$ is the second remaining capacity change value, $\Delta SOC1$ is the first remaining capacity change value, $\Delta CC1$ is the first additional capacity corresponding to the first switch in the closed state, and $\Delta CC2$ is the second additional capacity corresponding to the second switch in the closed state.

In other words, additional capacities consumed when the first switch and the second switch are in the closed state are considered in an actual application. For two batteries connected in series, when a switch A is closed and a switch B is opened, a sum of currents flowing through a battery A and a resistor is the same as a quantity of currents flowing through a battery B, and there is same current duration. Therefore, a quantity of charges flowing through the battery A and the resistor is equal to a quantity of charges flowing through the battery B. Similarly, when the switch A is opened and the switch B is closed, a quantity of currents flowing through the battery A is the same as a sum of currents flowing through the battery B and the resistor, and there is same current duration. Therefore, a quantity of charges flowing through the battery A is equal to a quantity of charges flowing through the battery B and the resistor.

In an embodiment, the obtaining a first remaining capacity change value corresponding to the first battery when the first battery is switched between a fully charged state and a fully discharged state includes: when the first battery is in one state in the fully charged state or the fully discharged state, obtaining a first open-circuit voltage of the first battery, and determining, based on the first open-circuit voltage, a first remaining capacity corresponding to the first battery; when the first battery is in the other state in the fully charged state or the fully discharged state, obtaining a second open-circuit voltage corresponding to the first battery, and determining, based on the second open-circuit voltage, a second remaining capacity corresponding to the first battery; and determining a difference between the first remaining capacity and the second remaining capacity as the first remaining capacity change value.

In an embodiment, the first remaining capacity corresponding to the first battery may be obtained by searching an OCV-TAB table based on the first open-circuit voltage. Similarly, the second remaining capacity corresponding to the first battery may be obtained by searching the OCV-TAB table based on the second open-circuit voltage. In a specific embodiment, the first battery switched from the fully charged state to the fully discharged state is used as an example. If a first open-circuit voltage corresponding to the first battery in the fully charged state is OCV1-start, a first remaining capacity level corresponding to the first battery is SOC1-start=OCV-TAB (OCV1-start). If a second open-circuit voltage corresponding to the first battery in the fully discharged state is OCV1-end, a second remaining capacity level corresponding to the first battery is SOC1-end=OCV-TAB (OCV1-end). Therefore, the first remaining capacity change value of the first battery is obtained by subtracting SOC1-end from SOC1-start.

In an embodiment, during switching from the fully charged state to the fully discharged state, the obtaining a second open-circuit voltage corresponding to the first battery includes: obtaining, in a preset period, a first voltage of the first battery, a second voltage of the second battery, a first temperature of the first battery, a second temperature of the second battery, and a discharge current corresponding to the first battery in a discharging process; and when either the first voltage or the second voltage is less than a preset voltage threshold, both the first temperature and the second temperature meet a preset temperature, and the discharge current is less than a preset current threshold, determining the second open-circuit voltage based on the first voltage, the discharge current, and circuit impedance, where the circuit impedance includes discharge line impedance, internal resistance of the first battery, and internal resistance of the second battery. In an embodiment, the second open-circuit voltage may be obtained based on the following formula:

$$OCV1\_end=V1+I*R$$

OCV1_end represents the second open-circuit voltage, V1 represents the first voltage of the first battery, I represents the discharge current, and R represents the circuit impedance.

In an embodiment, the method further includes: obtaining an initial remaining capacity corresponding to the first battery at an initial moment; determining a remaining capacity change value that is of the second battery and that exists from the initial moment to a current moment; obtaining a remaining capacity change value of the first battery by dividing a product of the remaining capacity change value corresponding to the second battery and the full charge capacity of the second battery by the full charge capacity of the first battery; determining, based on the initial remaining capacity and the remaining capacity change value of the first battery, a remaining capacity that is of the first battery and that exists at the current moment; and determining a remaining capacity of the electronic device based on the remaining capacity of the first battery and a remaining capacity of the second battery. In a specific implementation, the remaining capacity change value of the first battery may be calculated based on the following formula:

$$FCC1*(SOC1\_t1 - SOC1\_t2) = FCC2*(SOC2\_t1 - SOC2\_t2)$$

$$\Delta SOC = \frac{FCC2*(SOC2\_t1 - SOC2\_t2)}{FCC1}$$

$\Delta SOC = SOC1\_t1 - SOC1\_t2$ is a remaining capacity change value corresponding to the first battery from the initial moment to the current moment, $SOC1\_t1$ is a remaining capacity corresponding to the first battery at the initial moment, and $SOC1\_t2$ is the remaining capacity corresponding to the first battery at the current moment. $SOC2\_t1 - SOC2\_t2$ is the remaining capacity change value corresponding to the second battery, $SOC2\_t1$ is a remaining capacity corresponding to the second battery at the initial moment, $SOC2\_t2$ is a remaining capacity corresponding to the second battery at the current moment, t1 represents the initial moment, and t2 represents the current moment. In other words, that a same quantity of charges flow through the two batteries in a same time period is still used.

In an embodiment, the determining a remaining capacity of the electronic device based on the remaining capacity of the first battery and a remaining capacity of the second battery includes: determining, as a first target remaining capacity, a remaining capacity corresponding to a battery whose remaining capacity changes in the first battery and the second battery; and determining, as a remaining capacity that is of the electronic device and that exists at the current moment, a sum of an initially displayed value and a product of a scaling coefficient and a difference between the first target remaining capacity and a second target remaining capacity, where the initially displayed value is a remaining capacity displayed by the electronic device before the remaining capacity changes. In an embodiment, a remaining capacity level of the electronic device may be calculated based on the following formula:

$$SOC = Ratio*(SOCtemp - SOCstart) + UIstart$$

SOC is the remaining capacity level of the electronic device, Ratio is a scaling coefficient of an overall battery level change of the electronic device, SOCtemp is the first target remaining capacity, SOCstart is the second target remaining capacity, and UIstart is the initially displayed value.

In this embodiment, because a user usually focuses on an entire capacity of the electronic device, remaining capacities corresponding to the two batteries are fitted to obtain one remaining capacity for display.

In an embodiment, the method further includes: during switching from the fully discharged state to the fully charged state, determining, as the second target remaining capacity, an initial remaining capacity corresponding to a battery that first enters a fully charged state; and determining, as the scaling coefficient, a ratio of a difference obtained by subtracting the initially displayed value from a maximum remaining capacity to a difference obtained by subtracting the second target remaining capacity from the maximum remaining capacity; or during switching from the fully charged state to the fully discharged state, determining, as the second target remaining capacity, an initial remaining capacity corresponding to a battery that first enters a fully discharged state; and determining a ratio of the initially displayed value to the second target remaining capacity as the scaling coefficient. In other words, when the battery is in a charged state, the scaling coefficient may be determined with reference to the following formula:

$$Ratio = \frac{100\% - UIstart}{100\% - SOCstart}$$

When the battery is in a discharged state, refer to the following formula:

$$Ratio = \frac{UIstart}{SOCstart}$$

In this embodiment, corresponding scaling coefficient calculation formulas are provided for different states, to adapt to different application scenarios.

In an embodiment, before the obtaining a remaining capacity change value of the first battery by dividing a product of the remaining capacity change value of the second battery and the full charge capacity of the second battery by the full charge capacity of the first battery, the method further includes: obtaining a third additional capacity correspondingly consumed when a first switch is in a closed state from the initial moment to the current moment, where the first switch is connected to two ends of the first battery in parallel; and obtaining a fourth additional capacity correspondingly consumed when a second switch is in a closed state from the initial moment to the current moment, where the second switch is connected to two ends of the second battery in parallel; and the obtaining a remaining capacity change value of the first battery by dividing a product of the remaining capacity change value of the second battery and the full charge capacity of the second battery by the full charge capacity of the first battery includes: obtaining the remaining capacity change value of the first battery by dividing, by the full charge capacity of the first battery, a difference obtained by subtracting the third additional capacity from a sum of the fourth additional capacity and the product of the remaining capacity change value of the second battery and the full charge capacity of the second battery. In a specific implementation, refer to the following formula:

$$FCC1*(SOC1\_t1 - SOC1\_t2) + \Delta CC3 =$$
$$FCC2*(SOC2\_t1 - SOC2\_t2) + \Delta CC4$$

$$\Delta SOC = \frac{FCC2*(SOC2\_t1 - SOC2\_t2) + \Delta CC4 - \Delta CC3}{FCC1}$$

$\Delta CC3$ is the third additional capacity correspondingly consumed when the first switch is in the closed state from the initial moment to the current moment, and $\Delta CC4$ is the fourth additional capacity correspondingly consumed when the second switch is in the closed state from the initial moment to the current moment.

In an embodiment, the obtaining an initial remaining capacity corresponding to the first battery at an initial moment includes: obtaining a first initial voltage that is of the first battery and that exists at the initial moment and a second initial voltage that is of the second battery and that exists at the initial moment; determining an open-circuit voltage of the second battery based on a remaining capacity corresponding to the second battery at the initial moment; and obtaining an open-circuit voltage of the first battery by subtracting the second initial voltage from a sum of the open-circuit voltage of the second battery and the first initial voltage, and determining the initial remaining capacity of the first battery based on the open-circuit voltage of the first battery. In an embodiment, if the first initial voltage of the first battery is V1, the second initial voltage of the second battery is V2, the remaining capacity SOC2 corresponding to the second battery at the initial moment may be obtained by using the coulomb counter chip, and the open-circuit voltage OCV2=OCV-TAB (SOC2) may be obtained by searching the table, OCV1−OCV2=V1−V2, the open-circuit voltage of the first battery is OCV1=OCV2+V1−V2, and the initial remaining capacity of the first battery is SOC1_init=OCV-TAB (OCV1). Then, the remaining capacity that is of the first battery and that exists at the current moment may be determined based on the initial remaining capacity and the remaining capacity change value of the first battery. In an embodiment, the remaining capacity corresponding to the first battery at the current moment is obtained by subtracting the remaining capacity change value of the first battery from the initial remaining capacity.

SOC1=SOC1_init−ΔSOC

According to a second aspect, another battery capacity tracking method is provided. The method is applied to an electronic device, the electronic device includes a coulomb counter chip, and a first battery and a second battery that are connected in series, the coulomb counter chip is connected to two ends of the second battery in parallel, and the method includes: obtaining a third remaining capacity change value corresponding to the first battery when the first battery is switched from a fully charged state to a fully discharged state; obtaining a fourth remaining capacity change value corresponding to the second battery when the second battery is switched from a fully charged state to a fully discharged state; and obtaining a full charge capacity of the first battery by dividing a product of a full charge capacity of the second battery and the fourth remaining capacity change value by the third remaining capacity change value.

In an embodiment, the obtaining a third remaining capacity change value corresponding to the first battery when the first battery is switched from a fully charged state to a fully discharged state includes: when the first battery is in the fully charged state, obtaining a third open-circuit voltage of the first battery, and determining, based on the third open-circuit voltage, a third remaining capacity corresponding to the first battery; when the first battery is in the fully discharged state, obtaining a fourth open-circuit voltage corresponding to the first battery, and determining, based on the fourth open-circuit voltage, a fourth remaining capacity corresponding to the first battery; and determining a difference between the third remaining capacity and the fourth remaining capacity as the third remaining capacity change value.

According to a third aspect, a battery capacity tracking apparatus is provided. The apparatus is applied to an electronic device, the electronic device includes a coulomb counter chip, and a first battery and a second battery that are connected in series, the coulomb counter chip is connected to two ends of the second battery in parallel, and the apparatus includes: a first obtaining unit, configured to obtain a first remaining capacity change value corresponding to the first battery when the first battery is switched between a fully charged state and a fully discharged state; a second obtaining unit, configured to obtain a second remaining capacity change value corresponding to the second battery when the second battery is switched between a fully charged state and a fully discharged state; and a first determining unit, configured to determine a full charge capacity of the first battery based on the first remaining capacity change value, the second remaining capacity change value, and a full charge capacity of the second battery, where the full charge capacity of the second battery is directly obtained by using the coulomb counter chip.

In an embodiment, the first determining unit is configured to obtain the full charge capacity of the first battery by dividing a product of the full charge capacity of the second battery and the second remaining capacity change value by the first remaining capacity change value.

In an embodiment, during switching from the fully discharged state to the fully charged state, the first determining unit includes: a first determining subunit, configured to determine a first additional capacity correspondingly consumed when a first switch is in a closed state in a charging process, where the first switch is connected to two ends of the first battery in parallel; a second determining subunit, configured to determine a second additional capacity correspondingly consumed when a second switch is in a closed state in the charging process, where the second switch is connected to the two ends of the second battery in parallel; and a first calculation subunit, configured to obtain the full charge capacity of the first battery by dividing, by the first remaining capacity change value, a difference obtained by subtracting the first additional capacity from a sum of the second additional capacity and the product of the full charge capacity of the second battery and the second remaining capacity change value.

In an embodiment, the first obtaining unit includes: a first obtaining subunit, configured to: when the first battery is in one state in the fully charged state or the fully discharged state, obtain a first open-circuit voltage of the first battery, and determine, based on the first open-circuit voltage, a first remaining capacity corresponding to the first battery; a second obtaining subunit, configured to: when the first battery is in the other state in the fully charged state or the fully discharged state, obtain a second open-circuit voltage corresponding to the first battery, and determine, based on the second open-circuit voltage, a second remaining capacity corresponding to the first battery; and a third determining subunit, configured to determine a difference between the first remaining capacity and the second remaining capacity as the first remaining capacity change value.

In an embodiment, during switching from the fully charged state to the fully discharged state, the second obtaining subunit is configured to: obtain, in a preset period, a first voltage of the first battery, a second voltage of the second battery, a first temperature of the first battery, a second temperature of the second battery, and a discharge current corresponding to the first battery in a discharging process; and when either the first voltage or the second voltage is less than a preset voltage threshold, both the first temperature and the second temperature meet a preset temperature, and the discharge current is less than a preset current threshold, determine the second open-circuit voltage based on the first voltage, the discharge current, and circuit impedance, where the circuit impedance includes discharge line impedance, internal resistance of the first battery, and internal resistance of the second battery.

In an embodiment, the apparatus further includes: a third obtaining unit, configured to obtain an initial remaining capacity corresponding to the first battery at an initial moment; a second determining unit, configured to determine a remaining capacity change value that is of the second battery and that exists from the initial moment to a current moment; a fourth obtaining unit, configured to obtain a remaining capacity change value of the first battery by dividing a product of the remaining capacity change value corresponding to the second battery and the full charge capacity of the second battery by the full charge capacity of the first battery; a third determining unit, configured to determine, based on the initial remaining capacity and the remaining capacity change value of the first battery, a remaining capacity that is of the first battery and that exists at the current moment; and a fourth determining unit, configured to determine a remaining capacity of the electronic device based on the remaining capacity of the first battery and a remaining capacity of the second battery.

In an embodiment, the fourth determining unit includes: a fourth determining subunit, configured to determine, as a first target remaining capacity, a remaining capacity corresponding to a battery whose remaining capacity changes in the first battery and the second battery; and a second calculation subunit, configured to determine, as a remaining capacity that is of the electronic device and that exists at the current moment, a sum of an initially displayed value and a product of a scaling coefficient and a difference between the first target remaining capacity and a second target remaining capacity, where the initially displayed value is a remaining capacity displayed by the electronic device before the remaining capacity changes.

In an embodiment, the apparatus further includes: a fifth determining unit, configured to: during switching from the fully discharged state to the fully charged state, determine, as the second target remaining capacity, an initial remaining capacity corresponding to a battery that first enters a fully charged state; and a first calculation unit, configured to determine, as the scaling coefficient, a ratio of a difference obtained by subtracting the initially displayed value from a maximum remaining capacity to a difference obtained by subtracting the second target remaining capacity from the maximum remaining capacity; or a sixth determining unit, configured to: during switching from the fully charged state to the fully discharged state, determine, as the second target remaining capacity, an initial remaining capacity corresponding to a battery that first enters a fully discharged state; and a second calculation unit, configured to determine a ratio of the initially displayed value to the second target remaining capacity as the scaling coefficient.

In an embodiment, the apparatus further includes: a fifth obtaining unit, configured to obtain a third additional capacity correspondingly consumed when a first switch is in a closed state from the initial moment to the current moment, where the first switch is connected to two ends of the first battery in parallel; and a sixth obtaining unit, configured to obtain a fourth additional capacity correspondingly consumed when a second switch is in a closed state from the initial moment to the current moment, where the second switch is connected to two ends of the second battery in parallel. The fourth obtaining unit is configured to obtain the remaining capacity change value of the first battery by dividing, by the full charge capacity of the first battery, a difference obtained by subtracting the third additional capacity from a sum of the fourth additional capacity and the product of the remaining capacity change value of the second battery and the full charge capacity of the second battery.

In an embodiment, the third obtaining unit includes: a third obtaining subunit, configured to obtain a first initial voltage that is of the first battery and that exists at the initial moment and a second initial voltage that is of the second battery and that exists at the initial moment; a fifth determining subunit, configured to determine an open-circuit voltage of the second battery based on a remaining capacity corresponding to the second battery at the initial moment; and a sixth determining subunit, configured to: obtain an open-circuit voltage of the first battery by subtracting the second initial voltage from a sum of the open-circuit voltage of the second battery and the first initial voltage, and determine the initial remaining capacity of the first battery based on the open-circuit voltage of the first battery.

According to a fourth aspect, another battery capacity tracking apparatus is provided. The apparatus is applied to an electronic device, the electronic device includes a coulomb counter chip, and a first battery and a second battery that are connected in series, the coulomb counter chip is connected to two ends of the second battery in parallel, and the method includes: a seventh obtaining unit, configured to obtain a third remaining capacity change value corresponding to the first battery when the first battery is switched from a fully charged state to a fully discharged state; an eighth obtaining unit, configured to obtain a fourth remaining capacity change value corresponding to the second battery when the second battery is switched from a fully charged state to a fully discharged state; and a third calculation unit, configured to obtain a full charge capacity of the first battery by dividing a product of a full charge capacity of the second battery and the fourth remaining capacity change value by the third remaining capacity change value.

In an embodiment, the seventh obtaining unit includes: a seventh determining subunit, configured to: when the first battery is in the fully charged state, obtain a third open-circuit voltage of the first battery, and determine, based on the third open-circuit voltage, a third remaining capacity corresponding to the first battery; an eighth determining subunit, configured to: when the first battery is in the fully discharged state, obtain a fourth open-circuit voltage corresponding to the first battery, and determine, based on the fourth open-circuit voltage, a fourth remaining capacity corresponding to the first battery; and a ninth determining subunit, configured to determine a difference between the third remaining capacity and the fourth remaining capacity as the third remaining capacity change value.

According to a fifth aspect, an electronic device is provided. The electronic device includes a first battery, a second battery, a controller, a charging integrated circuit, and a coulomb counter chip; the first battery and the second battery are connected in series, to supply power to the electronic device; an input end of the charging integrated circuit is configured to be connected to a charging adapter, to charge the first battery and the second battery; the coulomb counter chip is connected to the second battery in parallel, and is configured to: monitor a remaining capacity and a full charge capacity of the second battery, and send the remaining capacity and the full charge capacity to the controller; and the controller is configured to: obtain a first remaining capacity change value corresponding to the first battery when the first battery is switched between a fully charged state and a fully discharged state; obtain a second remaining capacity change value corresponding to the second battery when the second battery is switched between a fully charged state and a fully discharged state; and determine a full charge capacity of the first battery based on the first remaining capacity change value, the second remaining capacity change value, and the full charge capacity of the second battery, where the full charge capacity of the second battery is directly obtained by using a coulomb counter chip of a coulometric sensor. In other words, this application provides an electronic device. The electronic device may include two batteries connected in series, to supply power to the electronic device by using the two batteries connected in series, so as to meet a requirement of the electronic device for a large battery capacity. In addition, because the coulomb counter chip is connected to two ends of the second battery in parallel, the controller may directly obtain, by using the coulomb counter chip, the full charge capacity of the second battery and the second remaining capacity change value corresponding to the second battery when the second battery is switched between the fully charged state and the fully discharged state. Therefore, the full charge capacity of the first battery may be determined based on the first remaining capacity change value corresponding to the first battery when the first battery is switched between the fully charged state and the fully discharged state, the second remaining capacity change value corresponding to the second battery when the second battery is switched between the fully charged state and the fully discharged state, and the full charge capacity of the second battery.

In an embodiment, the electronic device further includes a first switch and a second switch;
  the first switch and a resistor are connected in series and are connected to two ends of the first battery in parallel, and the second switch and a resistor are connected in series and are connected to two ends of the second battery in parallel; and
  the controller is configured to: when a difference between a voltage of the first battery and a voltage of the second battery is greater than a first preset voltage in a charging process, close a switch connected to a battery with a large voltage value in parallel.

In an embodiment, the electronic device further includes an analog to digital converter; and the analog to digital converter is connected to the first battery in parallel, and is configured to: collect the voltage of the first battery, convert a collected analog voltage into a digital voltage, and send the digital voltage to the controller.

In an embodiment, the controller is configured to obtain the full charge capacity of the first battery by dividing a product of the full charge capacity of the second battery and the second remaining capacity change value by the first remaining capacity change value.

In an embodiment, during switching from the fully discharged state to the fully charged state, the controller is further configured to: determine a first additional capacity correspondingly consumed when the first switch is in a closed state in the charging process, where the first switch is connected to the two ends of the first battery in parallel; determine a second additional capacity correspondingly consumed when the second switch is in a closed state in the charging process, where the second switch is connected to the two ends of the second battery in parallel; and obtain the full charge capacity of the first battery by dividing, by the first remaining capacity change value, a difference obtained by subtracting the first additional capacity from a sum of the second additional capacity and the product of the full charge capacity of the second battery and the second remaining capacity change value.

In an embodiment, the controller is configured to: when the first battery is in one state in the fully charged state or the fully discharged state, obtain a first open-circuit voltage of the first battery, and determine, based on the first open-circuit voltage, a first remaining capacity corresponding to the first battery; when the first battery is in the other state in the fully charged state or the fully discharged state, obtain a second open-circuit voltage corresponding to the first battery, and determine, based on the second open-circuit voltage, a second remaining capacity corresponding to the first battery; and determine a difference between the first remaining capacity and the second remaining capacity as the first remaining capacity change value.

In an embodiment, during switching from the fully charged state to the fully discharged state, the controller is further configured to: obtain, in a preset period, a first voltage of the first battery, a second voltage of the second battery, a first temperature of the first battery, a second temperature of the second battery, and a discharge current corresponding to the first battery in a discharging process; and when either the first voltage or the second voltage is less than a preset voltage threshold, both the first temperature and the second temperature meet a preset temperature, and the discharge current is less than a preset current threshold, determine the second open-circuit voltage based on the first voltage, the discharge current, and circuit impedance, where the circuit impedance includes discharge line impedance, internal resistance of the first battery, and internal resistance of the second battery.

In an embodiment, the controller is further configured to: obtain an initial remaining capacity corresponding to the first battery at an initial moment; determine a remaining capacity change value that is of the second battery and that exists from the initial moment to a current moment; obtain a remaining capacity change value of the first battery by dividing a product of the remaining capacity change value corresponding to the second battery and the full charge capacity of the second battery by the full charge capacity of the first battery; determine, based on the initial remaining capacity and the remaining capacity change value of the first battery, a remaining capacity that is of the first battery and that exists at the current moment; and determine a remaining capacity of the electronic device based on the remaining capacity of the first battery and a remaining capacity of the second battery.

In an embodiment, the controller is configured to: determine, as a first target remaining capacity, a remaining capacity corresponding to a battery whose remaining capacity changes in the first battery and the second battery; and determine, as a remaining capacity that is of the electronic device and that exists at the current moment, a sum of an initially displayed value and a product of a scaling coefficient and a difference between the first target remaining capacity and a second target remaining capacity, where the initially displayed value is a remaining capacity displayed by the electronic device before the remaining capacity changes.

In an embodiment, the controller is further configured to: during switching from the fully discharged state to the fully charged state, determine, as the second target remaining capacity, an initial remaining capacity corresponding to a battery that first enters a fully charged state; and determine, as the scaling coefficient, a ratio of a difference obtained by subtracting the initially displayed value from a maximum remaining capacity to a difference obtained by subtracting the second target remaining capacity from the maximum remaining capacity; or during switching from the fully charged state to the fully discharged state, determine, as the second target remaining capacity, an initial remaining capacity corresponding to a battery that first enters a fully discharged state; and determine a ratio of the initially displayed value to the second target remaining capacity as the scaling coefficient.

In an embodiment, the controller is further configured to: obtain a third additional capacity correspondingly consumed when a first switch is in a closed state from an initial moment to a current moment, where the first switch is connected to two ends of the first battery in parallel; and obtain a fourth additional capacity correspondingly consumed when a second switch is in a closed state from the initial moment to the current moment, where the second switch is connected to two ends of the second battery in parallel; and the controller is configured to obtain the remaining capacity change value of the first battery by dividing, by the full charge capacity of the first battery, a difference obtained by subtracting the third additional capacity from a sum of the fourth additional capacity and a product of the remaining capacity change value of the second battery and the full charge capacity of the second battery.

In an embodiment, the controller is configured to: obtain a first initial voltage that is of the first battery and that exists at an initial moment and a second initial voltage that is of the second battery and that exists at the initial moment; determine an open-circuit voltage of the second battery based on a remaining capacity corresponding to the second battery at the initial moment; and obtain an open-circuit voltage of the first battery by subtracting the second initial voltage from a sum of the open-circuit voltage of the second battery and the first initial voltage, and determine an initial remaining capacity of the first battery based on the open-circuit voltage of the first battery.

It can be learned that the embodiments of this application have the following beneficial effects:

In the embodiments of this application, for the two batteries connected in series, that is, the first battery and the second battery, the first remaining capacity change value corresponding to the first battery when the first battery is switched between the fully charged state and the fully discharged state and the second remaining capacity change value corresponding to the second battery when the second battery is switched between the fully charged state and the fully discharged state are first obtained. When a battery is switched from a fully charged state to a fully discharged state, it indicates a discharging process; and when the battery is switched from the fully discharged state to the fully charged state, it indicates a charging process. To be specific, when the battery is in the discharging process, a remaining capacity change value corresponding to the first battery in the discharging process and a remaining capacity change value corresponding to the second battery in the discharging process are obtained; and when the battery is in the charging process, a remaining capacity change value corresponding to the first battery in the charging process and a remaining capacity change value corresponding to the second battery in the charging process are obtained. After a remaining capacity change value corresponding to each battery in a process is obtained, the full charge capacity of the first battery is determined based on the first remaining capacity change value of the first battery, the second remaining capacity change value, and the full charge capacity of the second battery. The full charge capacity of the second battery may be directly obtained by using an existing coulomb counter chip. In other words, according to the method provided in the embodiments of this application, the full charge capacities of the two batteries are obtained by using a single coulomb counter chip, to effectively monitor the two batteries connected in series.

DESCRIPTION OF EMBODIMENTS

To facilitate understanding of the method provided in the embodiments of this application, before the embodiments of this application are described, some physical elements in the embodiments of this application are explained.

A coulomb counter chip is a device on which intelligent control is performed by using an advanced microprocessor and that outputs a current battery level after operation processing is performed on an input signal. The coulomb counter chip may also be referred to as a coulomb counter apparatus or a coulomb counter integrated circuit (integrated circuit, IC), or referred to as a coulomb counter IC for short.

An analog to digital converter (ADC) is configured to sample a real-time voltage of a battery. If a single ADC component is used, a system cannot obtain an open-circuit voltage of a battery a. In this case, a controller needs to actively trigger the ADC converter to perform voltage sampling.

Switches A and B are voltage equalization control apparatuses of two batteries, and a current bypass is established, to charge a battery with a low voltage.

To make the foregoing objectives, characteristics, and advantages of this application clearer and more comprehensible, the following describes the embodiments of this application in more detail with reference to the accompanying drawings and specific implementations.

For ease of understanding the technical solutions provided in this application, the following first describes the background technologies in this application.

Figure 1:
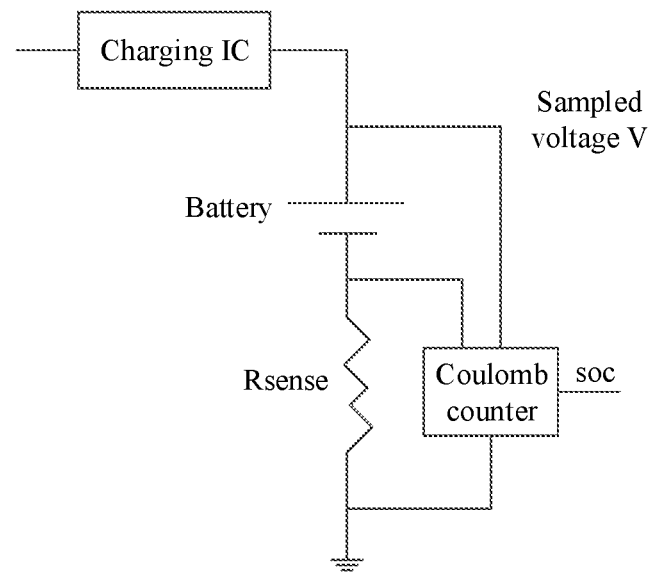
FIG. 1 is a diagram of a structure of a single battery according to an embodiment of this application.

In an embodiment, a principle in which a coulomb counter IC monitors a capacity of a single battery is first described. As shown in FIG. 1, the coulomb counter IC detects a voltage between two ends of a resistor Rsense and converts the voltage into a current value that is of the battery and that exists in a discharging or charging process. Integration is further performed, in terms of time, on a current flowing through a coulomb counter (CC) in a time period from t1 to t2, to obtain a capacity change $\Delta CC$ (mAh) of the battery in the time period. When a remaining capacity corresponding to the battery at the moment t1 is C1, a remaining capacity C2 (mAh), namely, (C1+$\Delta CC$) corresponding to the battery at the moment t2 is determined based on C1 and $\Delta CC$. Usually, a remaining capacity C2 (mAh) corresponding to a current moment is not directly displayed on the electronic device, but is converted into a capacity percentage (C1+$\Delta CC$)/FCC, namely, a remaining capacity. A full charge capacity (FCC) is a battery capacity corresponding to a battery in a fully charged state, and the remaining capacity is a battery capacity corresponding to a battery at any moment in a charging or discharging process.

Usually, a memory of the electronic device stores an initial FCC of the battery, and the FCC changes during use of the battery. Therefore, the full charge capacity may be periodically updated by using a coulomb counter. In an embodiment, the battery is completely charged and discharged once, and the coulomb counter IC detects the voltage between the two ends of the resistor Rsense and converts the voltage into a current value of the battery in a complete charging and discharging process. Integration is further performed on a current in terms of time (e.g., time used for complete charging and discharging), to obtain the full charge capacity FCC of the battery.

In addition, the coulomb counter may further sample a voltage of the battery in real time. When it is detected that the battery has low load for a long period of time, a voltage corresponding to the battery when the battery has low load may approximate an open-circuit voltage (OCV). A remaining capacity SOC corresponding to a current open-circuit voltage is found by using an OCV-TAB table, to correct the remaining capacity of the battery, and further display the remaining capacity on a display interface of the electronic device. The OCV-TAB table is a mapping table between an open-circuit voltage OCV and a remaining capacity SOC. As shown in Table 1, when an open-circuit voltage between two ends of the battery is 4.17 V, a remaining capacity SOC corresponding to the open-circuit voltage is 100%, in other words, is the full charge capacity; or when an open-circuit voltage between two ends of the battery is 3.2 V, a remaining capacity SOC corresponding to the open-circuit voltage is 0%.

TABLE 1

OCV-TAB

| SOC (%) | OCV (V) |
|---|---|
| 100 | 4.17 |
| 85 | 4.04 |
| 55 | 3.83 |
| 45 | 3.80 |
| 25 | 3.75 |
| 15 | 3.69 |
| 10 | 3.68 |
| 5 | 3.59 |
| 0 | 3.21 |

Figure 2A:
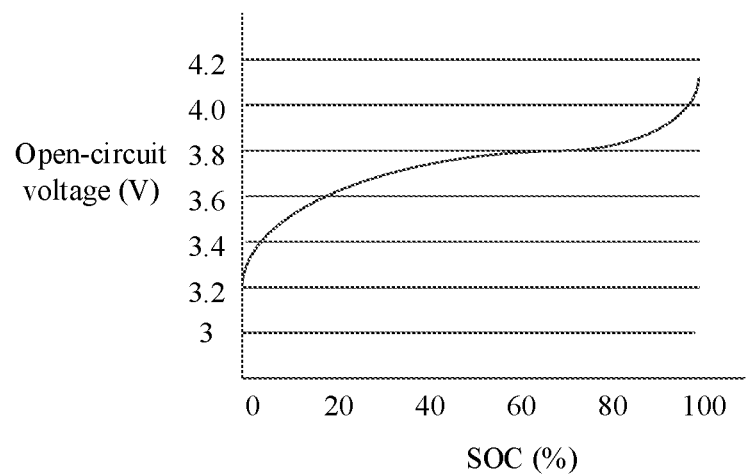
FIG. 2A is a graph of a change in an open-circuit voltage and a remaining capacity.

For ease of understanding of the COV-TAB table, refer to a graph of OCV-SOC in FIG. 2a. As shown in FIG. 2a, in a middle interval (20%<SOC<80%) of a curve, there is a very small change in the OCV of the battery, and the battery is in a plateau. However, in intervals at two ends (SOC<10% and SOC>90%) of the curve, there is a large change rate of the OCV. The entire OCV-SOC curve of the battery is flat in a middle area and steep at the two ends: a head end and a tail end. In other words, when the open-circuit voltage OCV is obtained, the SOC is estimated based on this stable correspondence.

Figure 2B:
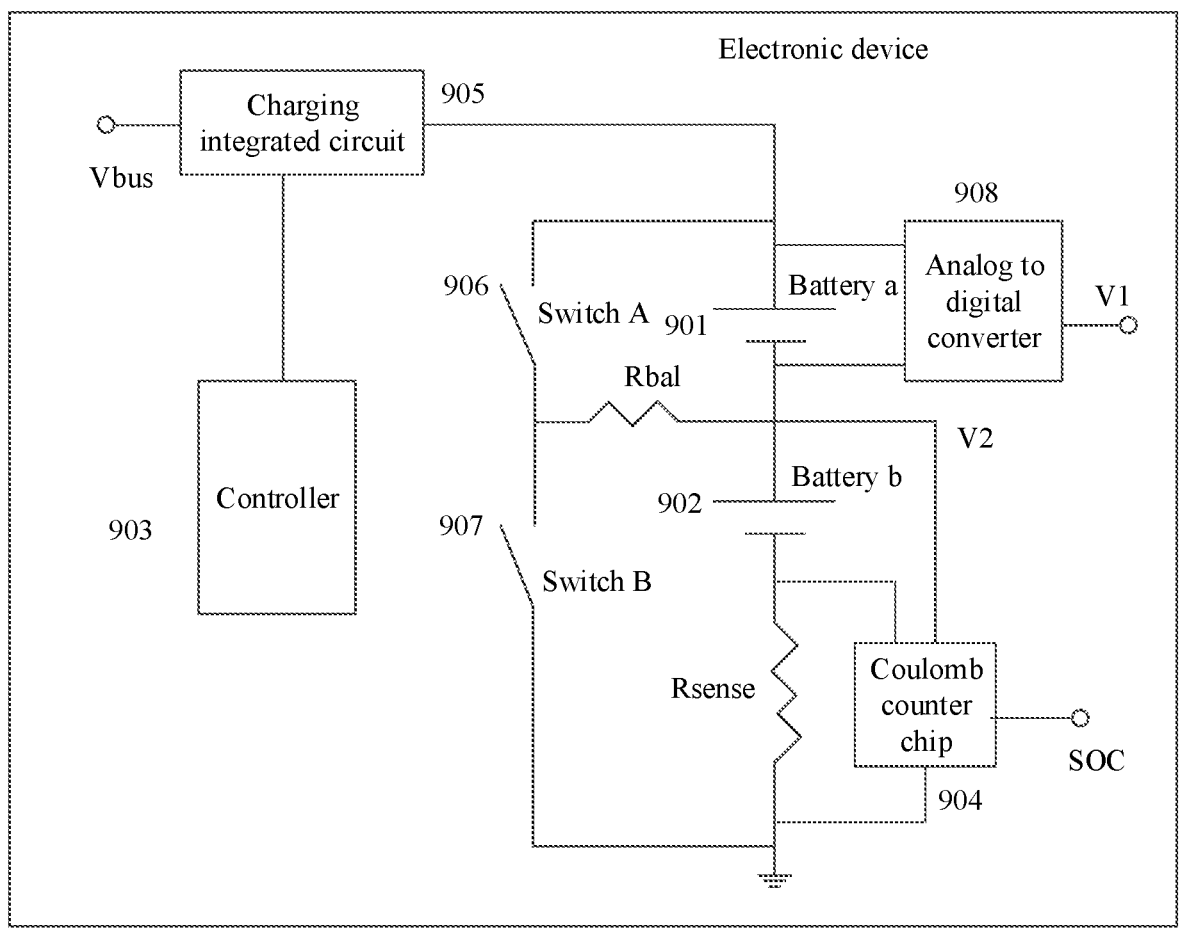
FIG. 2B is a diagram of a structure of an electronic device according to an embodiment of this application.

However, for a structure in which two batteries are connected in series, as shown in FIG. 2b, a single coulomb counter can track only a full charge capacity FCC and a remaining capacity SOC of a single battery (e.g., battery b), and cannot track a full charge capacity and a remaining capacity of the other battery (e.g., battery a). Consequently, a battery management system (BMS) cannot monitor the other battery. It can be understood that, a coulomb counter may also be connected to two ends of the other battery in parallel, so that the BMS can monitor the full charge capacity of the other battery. However, in this case, not only a volume of a battery system is increased, but also production costs are increased.

Based on this, an embodiment of this application provides a battery capacity tracking method, statistics about a full charge capacity of another battery in two batteries connected in series are collected based on an existing single coulomb counter without adding an additional device, to reduce a volume and costs of an electronic device, and effectively monitor the two batteries connected in series. In an embodiment, when a battery is switched from a fully charged state to a fully discharged state or from a fully discharged state to a fully charged state, a first remaining capacity change value corresponding to a first battery (e.g., battery a) when the first battery is switched between the two states and a second remaining capacity change value corresponding to the second battery (e.g., battery b) when the second battery is switched between the two states are obtained. Then, a full charge capacity of the first battery is determined based on the first remaining capacity change value, the second remaining capacity change value, and a full charge capacity of the second battery.

In other words, a core idea of this application is to derive a full charge capacity of the other battery by using a known full charge capacity of one battery. A derivation principle is that when the battery is charged and discharged, an equal quantity of charges flow through the two batteries. In addition, in this application, a remaining capacity of the other battery may be further derived based on a known remaining capacity change value of the battery.

Example Method

To facilitate understanding of the battery capacity tracking method provided in this application, a specific implementation of the method is described below with reference to the accompanying drawings.

Figure 3:
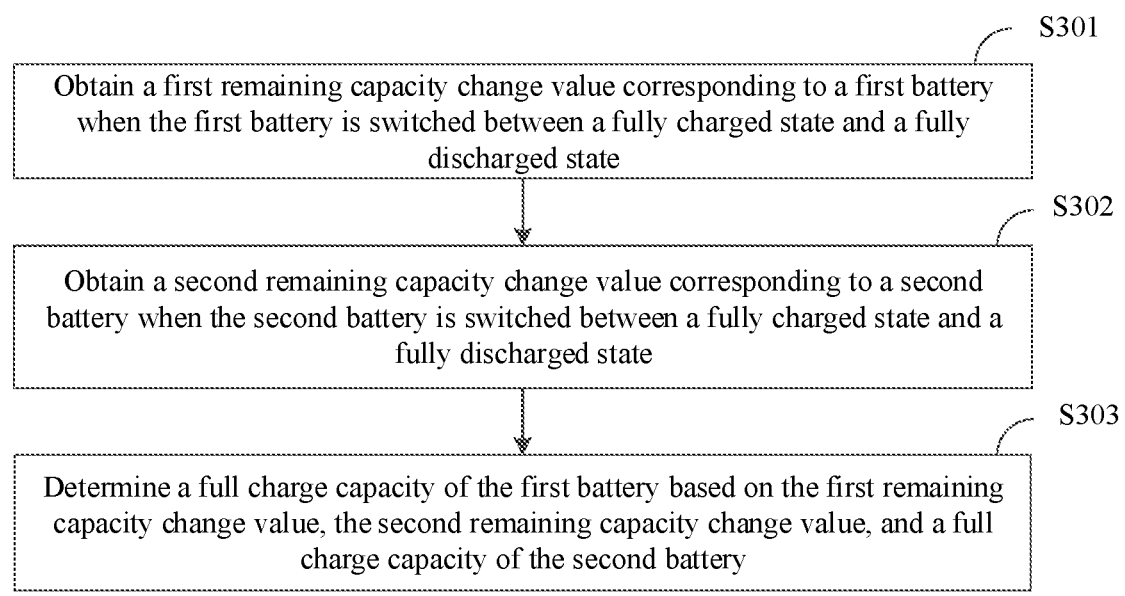
FIG. 3 is a flowchart of a battery capacity tracking method according to an embodiment of this application.

FIG. 3 is a flowchart of a battery capacity tracking method according to an embodiment of this application.

The method is applied to an electronic device, the electronic device includes a coulomb counter chip, and a first battery and a second battery that are connected in series, the coulomb counter chip is connected to two ends of the second battery in parallel, and the method includes the following operations.

S301: Obtain a first remaining capacity change value corresponding to the first battery when the first battery is switched between a fully charged state and a fully discharged state.

S302: Obtain a second remaining capacity change value corresponding to the second battery when the second battery is switched between a fully charged state and a fully discharged state.

In an embodiment, a battery switched between a fully charged state and a fully discharged state may mean that the battery is in a discharged state or the battery is in a charged state. When the battery is in the discharged state, in other words, is switched from the fully charged state to the fully discharged state, a first remaining capacity change value corresponding to the first battery when discharging is completed and a second remaining capacity change value corresponding to the second battery when discharging is completed are obtained. Similarly, according to another embodiment, when the battery is in the charged state, in other words, is switched from the fully discharged state to the fully charged state, a first remaining capacity change value corresponding to the first battery when charging is completed and a second remaining capacity change value corresponding to the second battery when charging is completed are obtained. Specific representation forms of the fully charged state and the fully discharged state may be determined based on an actual application situation. This is not limited herein in this embodiment. For example, when a voltage between two ends of the battery reaches 4.17 V, it may be determined that the battery is in the fully charged state, and when the voltage between the two ends of the battery is less than 3.21 V, it may be determined that the battery is in the fully discharged state.

The fully charged state is a state corresponding to the battery when a remaining capacity of the battery is 100%, and the fully discharged state is a state corresponding to the battery when a remaining capacity of the battery is 0%. In an actual application, a controller may detect a value of the remaining capacity by using a coulomb counter, to determine whether the battery enters the fully charged state or the fully discharged state.

In an embodiment, a remaining capacity corresponding to the first battery in the fully charged state and a remaining capacity corresponding to the first battery when the first battery is switched to the fully discharged state after being discharged are obtained, and then the first remaining capacity change value of the first battery is determined based on different remaining capacities corresponding to the two states. Similarly, a remaining capacity corresponding to the second battery in the fully charged state and a remaining capacity corresponding to the second battery when the second battery is switched to the fully discharged state after being discharged are obtained, and then the second remaining capacity change value of the second battery is determined based on different remaining capacities corresponding to the two states.

Alternatively, a remaining capacity corresponding to the first battery in the fully discharged state and a remaining capacity corresponding to the first battery when the first battery is switched to the fully charged state after being charged are obtained, and then the first remaining capacity change value of the first battery is determined based on different remaining capacities corresponding to the two states. A remaining capacity corresponding to the second battery in the fully discharged state and a remaining capacity corresponding to the second battery when the second battery is switched to the fully charged state after being charged are obtained, and then the second remaining capacity change value of the second battery is determined based on different remaining capacities corresponding to the two states.

In an embodiment, remaining capacities of the second battery in different states may be directly obtained by using the coulomb counter chip, and further, the second remaining capacity change value of the second battery may be directly obtained through calculation. However, a remaining capacity of the first battery can be obtained only after additional calculation is performed, to obtain the first remaining capacity change value of the first battery. Therefore, in a possible implementation of this embodiment, an implementation of obtaining the first remaining capacity change value corresponding to the first battery when the first battery is switched between the fully charged state and the fully discharged state is provided, and is as follows:

(1) When the first battery is in one state in the fully charged state or the fully discharged state, a first open-circuit voltage of the first battery is obtained, and a first remaining capacity corresponding to the first battery is determined based on the first open-circuit voltage.

(2) When the first battery is in the other state in the fully charged state or the fully discharged state, a second open-circuit voltage corresponding to the first battery is obtained, and a second remaining capacity corresponding to the first battery is determined based on the second open-circuit voltage.

In an embodiment, regardless of whether the first battery is in a discharging process or a charging process, when the first battery is in one state in the fully charged state or the fully discharged state, a first open-circuit voltage corresponding to a current state may be obtained, and then, a first remaining capacity corresponding to the first open-circuit voltage may be obtained by searching an OCV-TAB table. For example, if the first open-circuit voltage corresponding to the first battery (a battery a) in the current state is OCVa-start, a first remaining capacity level corresponding to the first battery is SOCa-start=OCV-TAB (OCVa-start).

When the first battery is switched from one state to another state, a second open-circuit voltage corresponding to the first battery in a current state is obtained, and then a second remaining capacity corresponding to the second open-circuit voltage is obtained by searching the OCV-TAB table. For example, if the second open-circuit voltage corresponding to the first battery (the battery a) in the current state is OCVa-end, a second remaining capacity level corresponding to the first battery is SOCa-end=OCV-TAB (OCVa-end). The first open-circuit voltage and the second open-circuit voltage of the first battery may be collected by an ADC connected in parallel.

It should be noted that, when the battery is fully charged and starts to discharge, a charger is used to supply power to the electronic device when the battery is just fully charged, and a coulomb counter detects that a current I of the battery is close to 0 and lasts for a specific period of time T (e.g., a period of battery stabilization time obtained based on a battery characteristic), and it is determined that the battery is in a standing state. In this case, a voltage between two ends of the first battery is the first open-circuit voltage, and the first remaining capacity SOC of the first battery (the battery a) may be accurately obtained by searching the OCV-TAB table. It can be understood that, in the fully charged state, the remaining capacity SOC corresponding to the first battery is 100%.

In an embodiment, when the first battery is switched from the fully charged state to the fully discharged state, in other words, in the discharging process, the second open-circuit voltage corresponding to the first battery may be obtained in another manner. Specifically, a first voltage of the first battery, a second voltage of the second battery, a first temperature of the first battery, a second temperature of the second battery, and a discharge current corresponding to the first battery in the discharging process is obtained in a preset period; and when either the first voltage or the second voltage is less than a preset voltage threshold, both the first temperature and the second temperature meet a preset temperature, and the discharge current is less than a preset current threshold, the second open-circuit voltage is determined based on the first voltage, the discharge current, and circuit impedance. The circuit impedance includes at least discharge line impedance, internal resistance of the first battery, and internal resistance of the second battery.

In other words, when the first battery and the second battery start to discharge, a discharge current I of the first battery in the discharging process, a first voltage V1 of the first battery, a second voltage V2 of the second battery, a first temperature T1 of the first battery, and a second temperature T2 of the second battery may be periodically sampled. When it is detected that (V1 or V2) is less than the preset voltage threshold, the discharge current I is less than the preset current threshold, and both the first temperature T1 and the second temperature T2 meet a preset temperature, the second open-circuit voltage is determined based on the first voltage V1, the discharge current I, and circuit impedance R. In an embodiment, a sum of the first voltage V1 and a product of the discharge current I and the circuit impedance R is determined as the second open-circuit voltage. In other words, OCV1_end=V1+I*R. The preset voltage threshold may be preset based on an actual application situation. For example, a voltage corresponding to the electronic device at a moment at which the electronic device is to be turned off is determined as the preset voltage threshold.

It should be noted that, to further improve accuracy of the determined second open-circuit voltage, whether duration in which the discharge current is less than the preset current threshold meets preset duration when the discharge current is less than the preset current threshold may be further determined, and if the duration in which the discharge current is less than the preset current threshold meets the preset duration, the second open-circuit voltage is determined based on the first voltage V1, the discharge current I, and the circuit impedance R, and the second remaining capacity is determined based on the second open-circuit voltage.

It should be noted that, in the discharging process, a voltage corresponding to the first battery in the fully discharged state, instead of a voltage corresponding to any moment in the discharging process, is obtained, because a discharge current I corresponding to the first battery when the first battery is to be fully discharged is small enough, and a voltage V1 between the two ends is also small. In addition, it can be learned from a battery discharge voltage curve (a trend of the battery discharge voltage curve is basically the same as that in FIG. 2b) that, there is a small voltage change amplitude but a large remaining capacity change in a power-intensive interval (a plateau of the curve), and there is a large voltage change amplitude but a small remaining capacity change when the battery is to be fully discharged. Therefore, the voltage corresponding to the first battery when the first battery is to be fully discharged is selected to search a table, to ensure that a more accurate remaining capacity is obtained by searching the OCV-TAB table.

(3) A difference between the first remaining capacity and the second remaining capacity is determined as the first remaining capacity change value.

To be specific, when the first remaining capacity and the second remaining capacity that are respectively corresponding to the first battery in the two different states are obtained, the first remaining capacity change value is obtained based on the difference of the first remaining capacity and the second remaining capacity.

S303: Determine a full charge capacity of the first battery based on the first remaining capacity change value, the second remaining capacity change value, and a full charge capacity of the second battery, where the full charge capacity of the second battery is directly obtained by using the coulomb counter chip.

When the first remaining capacity change value corresponding to the first battery when the first battery is switched between the two states and the second remaining capacity change value corresponding to the second battery when the second battery is switched between the two states are obtained, the full charge capacity of the first battery is determined based on the first remaining capacity change value, the second remaining capacity change value, and the full charge capacity that is of the second battery and that is obtained by using the coulomb counter chip.

In an embodiment, the full charge capacity of the first battery is obtained by dividing a product of the full charge capacity of the second battery and the second remaining capacity change value by the first remaining capacity change value. For actual calculation, refer to the following formula:

$$FCC1 * (SOC1\_start - SOC1\_end) = FCC2 * (SOC2\_start - SOC2\_end) \quad (1)$$

$$FCC1 = FCC2 * (SOC2\_start - SOC2\_end)/(SOC\_start - SOC1\_end) \quad (2)$$

It can be understood that the foregoing equation (1) is true because regardless of whether the two batteries connected in series are in the charged state or the discharged state, a same current flows through the two batteries, and there is same current duration. Therefore, an equal quantity of charges flow through the two batteries.

$$FCC1 = \frac{FCC2 * \Delta SOC2}{\Delta SOC1} \quad (3)$$

FCC1 is the full charge capacity of the first battery, FCC2 is the full charge capacity of the second battery, $\Delta SOC2 = SOC2\_start - SOC2\_end$ is the second remaining capacity change value, and $\Delta SOC1 = SOC1\_start - SOC1\_end$ is the first remaining capacity change value.

It should be noted that, because the first battery and the second battery are in a same state, and are simultaneously in the discharged state or the charged state, a plus/minus sign of the first remaining capacity change value corresponding to the first battery is the same as a plus/minus sign of the second remaining capacity change value corresponding to the second battery.

A person skilled in the art can understand that, during charging of the battery, to ensure charging equalization, equalization processing is performed on the two batteries connected in series, to ensure that each battery is fully charged. In an equalization circuit, a switch and a resistor are connected to each battery in parallel, and the resistor and the switch are connected in series. As shown in FIG. 2b, a switch A and a resistor Rbal are connected in series and then are connected to two ends of the battery a in parallel, and a switch B and the resistor Rbal are connected in series and then are connected to two ends of the battery b in parallel. In an embodiment, the controller may detect a voltage of each battery in real time. If it is detected that a voltage of a battery is too high and is greater than the preset voltage threshold, and a condition of performing equalization is met, a switch of the battery is closed. In this case, a current flows through a resistor corresponding to the battery, and a quantity of currents flowing through the battery is reduced, so that a charging speed of the battery is reduced, and the voltage of the battery is finally the same as a voltage of another battery.

It can be understood that, when the switch A (as shown in FIG. 2b) is closed, a current flows through the resistor Rbal. In this case, the resistor Rbal consumes a part of a battery level. Therefore, when the full charge capacity of the first battery (the battery a) is determined, the part of the battery level needs to be considered. Details are as follows:

(1) A first additional capacity correspondingly consumed when a first switch is in a closed state in the charging process is determined. The first switch is connected to two ends of the first battery in parallel.

In other words, when the first switch is closed in the charging process, closing duration of the first switch and a current flowing through a corresponding resistor when the first switch is closed are obtained, and then the consumed first additional capacity is determined based on the closing duration and the current. The current flowing through the corresponding resistor is determined based on a voltage between the two ends of the first battery and resistance. As shown in FIG. 2b, it is assumed that the closing duration of the first switch (the switch A) is t1, and the current flowing through the resistor is Ibal_a=Va/Rbal. Integration is performed on t1 and Ibal_a, to obtain the first additional capacity.

(2) A second additional capacity correspondingly consumed when a second switch is in a closed state in the charging process is determined. The second switch is connected to two ends of the second battery in parallel.

In other words, when the second switch is closed in the charging process, closing duration of the second switch and a current flowing through a corresponding resistor when the second switch is closed are obtained, and then the consumed second additional capacity is determined based on the closing duration and the current. The current flowing through the corresponding resistor is determined based on a voltage between the two ends of the second battery and resistance. As shown in FIG. 2b, it is assumed that the closing duration of the second switch (the switch B) is t2, and the current flowing through the resistor is Ibal_b=Vb/Rbal. Integration is performed on t2 and Ibal_b, to obtain the second additional capacity.

It should be noted that the first switch and the second switch cannot be simultaneously in the closed state. If the two switches are simultaneously closed, as shown in FIG. 2b, the two batteries are short-circuited, and cannot be charged.

(3) The full charge capacity of the first battery is obtained by dividing, by the first remaining capacity change value, a difference obtained by subtracting the first additional capacity from a sum of the second additional capacity and the product of the full charge capacity of the second battery and the second remaining capacity change value.

In other words, when both the first switch and the second switch are closed in the charging process, an additional capacity correspondingly consumed when each switch is closed is obtained. If a difference between correspondingly consumed additional capacities of the two switches is not equal to zero, an additional capacity needs to be considered when the full charge capacity of the first battery is determined. For specific calculation, refer to the following formula:

$$FCC1*\Delta SOC1+\Delta CC1=FCC2*\Delta SOC2+\Delta CC2 \quad (4)$$

It can be understood that the foregoing equation (4) is true because for two batteries connected in series, when the switch A is closed and a switch B is opened, a sum of currents flowing through a battery A and a resistor is the same as a quantity of currents flowing through a battery B, and there is same current duration. Therefore, a quantity of charges flowing through the battery A and the resistor is equal to a quantity of charges flowing through the battery B. Similarly, when the switch A is opened and the switch B is closed, a quantity of currents flowing through the battery A is the same as a sum of currents flowing through the battery B and the resistor, and there is same current duration. Therefore, a quantity of charges flowing through the battery A is equal to a quantity of charges flowing through the battery B and the resistor.

ΔCC1 is the first additional capacity corresponding to the first switch in the closed state, and ΔCC2 is the second additional capacity corresponding to the second switch in the closed state.

$$FCC1 = \frac{FCC2*\Delta SOC2 + \Delta CC2 - \Delta CC1}{\Delta SOC1} \quad (5)$$

$$FCC1 = \frac{FCC2*\Delta SOC2 + \Delta CC}{\Delta SOC1}$$

FCC1 is the full charge capacity of the first battery, FCC2 is the full charge capacity of the second battery, ΔSOC2 is the second remaining capacity change value, ΔSOC1 is the first remaining capacity change value, and ΔCC=ΔCC2−ΔCC1 is a difference between the second additional capacity and the first additional capacity.

It can be learned from the foregoing embodiment that, statistics about a full charge capacity of the other battery in the two batteries connected in series are collected based on an existing coulomb counter without adding an additional device, to reduce a volume and a cost of the electronic device, and effectively monitor the two batteries connected in series. In an embodiment, when a battery is switched from a fully charged state to a fully discharged state or from a fully discharged state to a fully charged state, the first remaining capacity change value corresponding to the first battery when the first battery is switched between the two states and a second remaining capacity change value corresponding to the second battery when the second battery is switched between the two states are obtained. Then, the full charge capacity of the first battery is determined based on the first remaining capacity change value, the second remaining capacity change value, and the full charge capacity of the second battery.

It can be understood that, in an embodiment, a BMS needs to monitor both a full charge capacity of each battery and a remaining capacity of each battery, to determine a remaining capacity of the electronic device based on the remaining capacity of each battery. Therefore, after the full charge capacity of the first battery is determined, the remaining capacity of the first battery may be further determined based on the full charge capacity of the first battery, and further, the overall remaining capacity of the electronic device is determined based on the remaining capacity of the first battery and a remaining capacity of the second battery. For ease of understanding, the following describes an implementation process of determining the remaining capacity of the electronic device with reference to the accompanying drawings.

Figure 4:
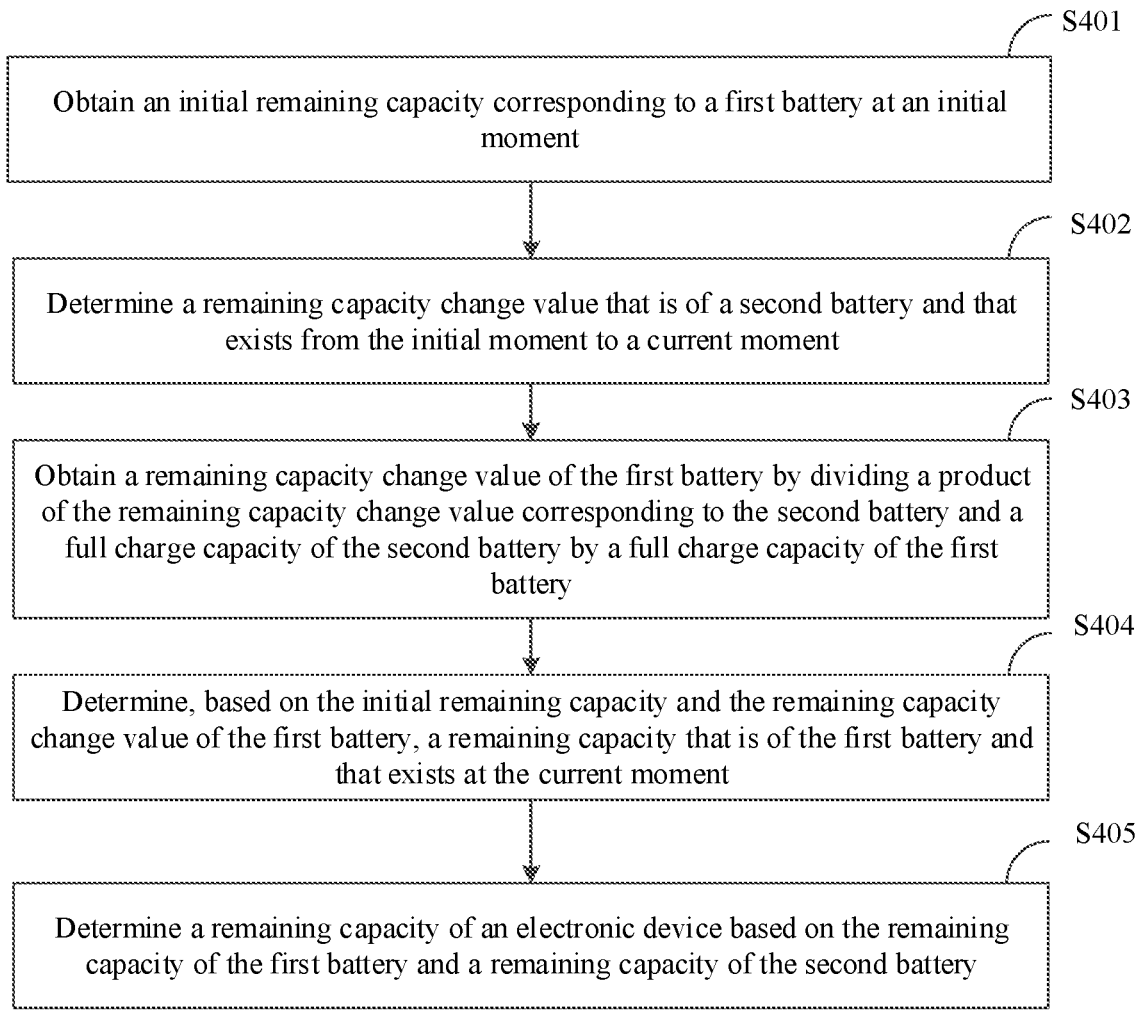
FIG. 4 is a flowchart of a method for tracking a remaining capacity of a battery according to an embodiment of this application.

FIG. 4 is a flowchart of a method for determining a remaining capacity of an electronic device according to an embodiment of this application. As shown in FIG. 4, the method may include the following operations.

S401: Obtain an initial remaining capacity corresponding to a first battery at an initial moment.

In an embodiment, the initial remaining capacity corresponding to the first battery at the initial moment is obtained, so that the remaining capacity of the electronic device is subsequently determined in real time based on the initial remaining capacity. The initial moment may be a corresponding moment at which the electronic device is turned on.

In an embodiment, the initial remaining capacity corresponding to the first battery at the initial moment may be obtained in the following manner:

(1) A first initial voltage that is of the first battery and that exists at the initial moment and a second initial voltage that is of a second battery and that exists at the initial moment are obtained.

The first initial voltage that is of the first battery and that exists at the initial moment may be obtained by using an ADC connected in parallel, and the second initial voltage that is of the second battery and that exists at the initial moment may be obtained by using a coulomb counter chip.

(2) An open-circuit voltage of the second battery is determined based on a remaining capacity corresponding to the second battery at the initial moment.

In other words, the remaining capacity corresponding to the second battery may be obtained in real time by using the coulomb counter chip, and then an open-circuit voltage corresponding to the remaining capacity at the initial moment is obtained by searching an OCV-TAB table.

(3) An open-circuit voltage of the first battery is obtained by subtracting the second initial voltage from a sum of the open-circuit voltage of the second battery and the first initial voltage, and the initial remaining capacity of the first battery is determined based on the open-circuit voltage of the first battery.

After the open-circuit voltage corresponding to the second battery at the initial moment is obtained, the open-circuit voltage of the first battery is obtained based on the open-circuit voltage of the second battery, the first initial voltage, and the second initial voltage. Then, the initial remaining capacity of the first battery is obtained by searching a table based on the open-circuit voltage of the first battery. It should be noted that, because currents of batteries connected in series have a same value, it may be approximately considered that a difference between voltages of the two batteries is equal to a difference between open-circuit voltages of the two batteries. In other words, OCV1−OCV2=V1−V2. Therefore, the open-circuit voltage of the first battery may be determined based on the first initial voltage of the first battery, the second initial voltage of the second battery, and the open-circuit voltage of the second battery.

As shown in FIG. 2b, if a first initial voltage of a first battery a is Va, a second initial voltage of a second battery b is Vb, a remaining capacity SOCb corresponding to the second battery b at the initial moment may be obtained by using the coulomb counter chip, and an open-circuit voltage OCVb=OCV-TAB (SOCb) may be obtained by searching the table, OCVa−OCVb=Va−Vb, the open-circuit voltage of the first battery is OCVa=OCVb+Va−Vb, and the initial remaining capacity of the first battery is SOCa_init=OCV-TAB (OCVa).

After charging or discharging is performed for a period of time from an initial moment t1, the following operations are performed.

S402: Determine a remaining capacity change value that is of the second battery and that exists from the initial moment to a current moment.

In an embodiment, the remaining capacity of the second battery at the initial moment and a remaining capacity at the current moment may be obtained by using the coulomb counter chip, to obtain the remaining capacity change value corresponding to the second battery from the initial moment to the current moment.

S403: Obtain a remaining capacity change value of the first battery by dividing a product of the remaining capacity change value corresponding to the second battery and a full charge capacity of the second battery by a full charge capacity of the first battery.

After the remaining capacity change value of the second battery, the full charge capacity of the second battery, and the full charge capacity of the first battery are obtained, the remaining capacity change value corresponding to the first battery from the initial moment to the current moment may be determined based on the foregoing parameters.

According to a principle of the formula (1), the following formulas can be obtained:

$$FCC1 * (SOC1\_t1 - SOC1\_t2) = FCC2(SOC2\_t1 - SOC2\_t2) \tag{6}$$

$$\Delta SOC = \frac{FCC2 * (SOC2\_t1 - SOC2\_t2)}{FCC1} \tag{7}$$

$\Delta SOC = SOC1\_t1 - SOC1\_t2$ is the remaining capacity change value corresponding to the first battery from the initial moment to the current moment, $SOC1\_t1$ is a remaining capacity corresponding to the first battery at the initial moment, and $SOC1\_t2$ is a remaining capacity corresponding to the first battery at the current moment. $SOC2\_t1 - SOC2\_t2$ is the remaining capacity change value corresponding to the second battery, $SOC2\_t1$ is the remaining capacity corresponding to the second battery at the initial moment, $SOC2\_t2$ is the remaining capacity corresponding to the second battery at the current moment, t1 represents the initial moment, and t2 represents the current moment.

It can be understood that, when the remaining capacity corresponding to the first battery is determined in real time, if a first switch or a second switch is closed, an additional capacity is consumed. To ensure accuracy of the obtained remaining capacity of the first battery, when the remaining capacity corresponding to the first battery is determined based on the remaining capacity change value of the second battery, the full charge capacity of the second battery, and the full charge capacity of the first battery, states of the first switch and the second switch further need to be considered. Details are as follows:

(1) A third additional capacity correspondingly consumed when the first switch is in a closed state from the initial moment to the current moment. The first switch is connected to two ends of the first battery in parallel.

(2) A fourth additional capacity correspondingly consumed when the second switch is in a closed state from the initial moment to the current moment. The second switch is connected to two ends of the first battery in parallel.

(3) The remaining capacity change value of the first battery is obtained by dividing, by the full charge capacity of the first battery, a difference obtained by subtracting the third additional capacity from a sum of the fourth additional capacity and the product of the remaining capacity change value of the second battery and the full charge capacity of the second battery.

It should be noted that, for a manner of obtaining the third additional capacity and the fourth additional capacity, refer to obtaining of the first additional capacity and the second additional capacity in the method embodiment shown in FIG. 3. Details are not described herein again in this embodiment. The remaining capacity change value of the first battery is determined based on the third additional capacity and the fourth additional capacity.

According to a principle of the formula (4), the following formula can be obtained:

$$FCC1*(SOC1\_t1-SOC1\_t2)+\Delta CC3=FCC2* \\ (SOC2\_t1-SOC2\_t2)+\Delta CC4 \quad (8)$$

ΔCC3 is the third additional capacity correspondingly consumed when the first switch is in the closed state from the initial moment to the current moment, and ΔCC4 is the fourth additional capacity correspondingly consumed when the second switch is in the closed state from the initial moment to the current moment.

$$\Delta SOC = \frac{FCC2*(SOC2\_t1 - SOC2\_t2) + \Delta CC4 - \Delta CC3}{FCC1} \quad (9)$$

$$\Delta SOC = \frac{FCC2*(SOC2\_t1 - SOC2\_t2) + \Delta CC_{t1-t2}}{FCC1}$$

Herein, $\Delta CC_{t1-t2} = \Delta CC4 - \Delta CC3$.

S404: Determine, based on the initial remaining capacity and the remaining capacity change value of the first battery, the remaining capacity that is of the first battery and that exists at the current moment.

In an embodiment, the remaining capacity corresponding to the first battery at the current moment is obtained by subtracting the remaining capacity change value of the first battery from the initial remaining capacity. In other words, SOC=SOC1_init−ΔSOC.

S405: Determine a remaining capacity of the electronic device based on the remaining capacity of the first battery and the remaining capacity of the second battery.

In an embodiment, after the remaining capacity of the first battery and the remaining capacity of the second battery are obtained, the remaining capacity of the electronic device is determined based on the remaining capacities respectively corresponding to the two batteries.

According to this embodiment, not only the remaining capacity of the first battery may be determined, but also the remaining capacity of the electronic device may be determined based on the remaining capacity of the first battery and the remaining capacity of the second battery.

Figure 5:
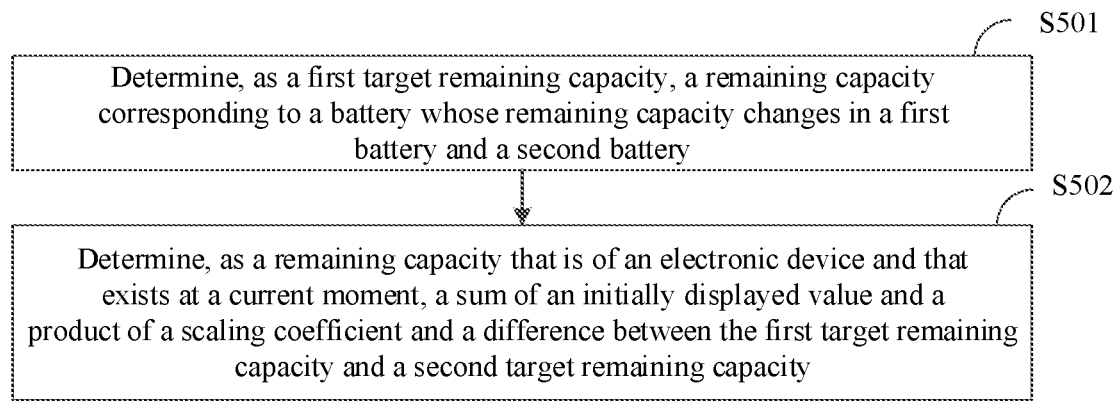
FIG. 5 is a flowchart of a method for tracking a remaining capacity of an electronic device according to an embodiment of this application.

In an embodiment, an embodiment provides an implementation of determining a remaining capacity of an electronic device. FIG. 5 is a flowchart of another method for determining a remaining capacity of an electronic device according to an embodiment of this application. The method includes the following operations.

S501: Determine, as a first target remaining capacity, a remaining capacity corresponding to a battery whose remaining capacity changes in a first battery and a second battery.

To be specific, a BMS may monitor respective remaining capacities of the first battery and the second battery in real time, and when detecting that a remaining capacity of one battery changes, determine, as the first target remaining capacity, a remaining capacity corresponding to the battery whose remaining capacity changes. For example, when a remaining capacity of the first battery changes, the remaining capacity of the first battery is determined as the first target remaining capacity; or when a remaining capacity of the second battery changes, the remaining capacity of the second battery is determined as the first target remaining capacity.

S502: Determine, as a remaining capacity that is of the electronic device and that exists at a current moment, a sum of an initially displayed value and a product of a scaling coefficient and a difference between the first target remaining capacity and a second target remaining capacity.

In other words, the remaining capacity that is of the electronic device and that exists at the current moment may be determined based on the first target remaining capacity, the second target remaining capacity, the scaling coefficient, and the initially displayed value, to display the remaining capacity on the electronic device. The initially displayed value is a remaining capacity displayed by the electronic device before the remaining capacity changes.

For a specific calculation process, refer to the following formula:

$$SOC = Ratio*(SOCtemp-SOCstart)+UIstart \quad (10)$$

SOC is a remaining capacity level of the electronic device, Ratio is the scaling coefficient, SOCtemp is the first target remaining capacity, SOCstart is the second target remaining capacity, and UIstart is the initially displayed value.

It should be noted that, in an actual application, a remaining capacity SOC corresponding to the electronic device at a moment at which a capacity of a battery changes may be calculated, or when a capacity of a battery changes, the battery is marked, and after a period of time, the remaining capacity corresponding to the battery at the current moment is determined as the first target remaining capacity, and then the remaining capacity of the electronic device at the current moment is calculated.

The second target remaining capacity may be determined based on states of charge of the first battery and the second battery, and the scaling coefficient may be determined based on the second target remaining capacity and the initially displayed value. Specifically, when the battery is being charged, in other words, in a process of being switched from a fully discharged state to a fully charged state, an initial remaining capacity corresponding to a battery that first enters a fully charged state is determined as the second target remaining capacity. In an embodiment, a battery that first enters a fully charged state may be determined in the following manner: A smaller value in FCCa*(1−SOCa) and FCCb*(1−SOCb) is determined, and a remaining capacity of a battery corresponding to the smaller value is determined as the second target remaining capacity. The initial remaining capacity corresponding to the battery that first enters a fully charged state is a remaining capacity corresponding to the battery at an initial moment of charging.

It can be learned from the foregoing descriptions that, in this embodiment, a remaining capacity corresponding to the battery whose remaining capacity first changes is determined as the first target remaining capacity, and a remaining capacity corresponding to the battery that first enters a fully charged state or the fully discharged state is determined as the second target remaining capacity. It can be understood that the battery that first enters a fully charged state or the fully discharged state is also the battery whose remaining capacity first changes. Therefore, a battery corresponding to the determined first target remaining capacity and a battery corresponding to the determined second target remaining capacity are a same battery. In other words, a battery that first enters a fully charged state or the fully discharged state is determined, to select a reference for subsequent calculation of the remaining capacity of the electronic device.

In an embodiment, when the battery that first enters a fully charged state or the fully discharged state is determined, the battery may be marked, and when a remaining capacity corresponding to the electronic device at a specific moment is calculated, a remaining capacity corresponding to the marked battery at the current moment is determined as the first target remaining capacity.

After the second target remaining capacity is determined, a ratio of a difference obtained by subtracting the initially displayed value from a maximum remaining capacity to a difference obtained by subtracting the second target remaining capacity from the maximum remaining capacity is determined as the scaling coefficient. Details are as follows:

$$\text{Ratio} = \frac{100\% - UIstart}{100\% - SOCstart} \quad (11)$$

For example, if the initially displayed value is 80% and the second target remaining capacity is 60%, the scaling coefficient Ratio is 0.5.

When the battery is being discharged, in other words, in a process of being switched from the fully charged state to the fully discharged state, an initial remaining capacity corresponding to a battery that first enters a fully discharged state is determined as the second target remaining capacity. In an actual application, a battery that first enters a fully discharged state may be determined in the following manner: a smaller value in SOCa*FCCa and SOCb*FCCb is determined, and a remaining capacity of a battery corresponding to the smaller value is determined as the second target remaining capacity. The initial remaining capacity corresponding to the battery that first enters a fully discharged state is a remaining capacity corresponding to the battery at an initial moment of discharging.

After the second target remaining capacity is determined, a ratio of the initially displayed value to the second target remaining capacity is determined as the scaling coefficient. Details are as follows:

$$\text{Ratio} = \frac{UIstart}{SOCstart} \quad (12)$$

It should be noted that, in an embodiment, the first target remaining capacity SOCtemp and the second target remaining capacity SOCstart are of a same battery, and a specific battery depends on a battery that is predicted to be fully charged first and a battery that is predicted to be fully discharged first in a charging/discharging scenario. In addition, the scaling coefficient Ratio, the second target remaining capacity SOCstart, and the initially displayed value UIstart are usually updated again during switching between the charging scenario and the discharging scenario, to cope with a change that is in the scaling ratio and that is caused by a scenario change. In addition, when a remaining capacity change value at two ends of the battery is greater than a preset threshold, the scaling coefficient may also be updated, to ensure accuracy of the determined remaining capacity of the electronic device. For example, when the preset threshold is 10%, and the remaining capacity change value at the two ends of the battery is greater than 10%, the scaling coefficient is updated.

For ease of understanding, when the battery just enters the charged state, a remaining capacity corresponding to a battery a is 60%, a remaining capacity corresponding to a battery b is 40%, and FCCa−SOCa*FCCa<FCCb−SOCb*FCCb. It can be learned that the battery a first enters a fully charged state. The second target remaining capacity SOCstart is an initial remaining capacity 60% corresponding to the battery a, and an identifier of the battery a is stored, so that when a remaining capacity corresponding to the electronic device at a moment is subsequently determined, a remaining capacity corresponding to the battery a at the moment is determined as the first target remaining capacity. When the remaining capacity corresponding to the battery a is 90% after the battery a is charged for a period of time, the first target remaining capacity SOCstemp is 90%. It is assumed that when the initially displayed value UIstart of the electronic device is 50%, the scaling coefficient Ratio is 5/4. In this case, a remaining capacity corresponding to the electronic device is (90%−60%)*5/4+50%=87.5%. In this case, 87% may be displayed.

When the battery is in the discharged state, the remaining capacity corresponding to the battery a is 60%, the remaining capacity corresponding to the battery b is 30%, and SOCa*FCCa<SOCb*FCCb. It can be learned that the battery b first enters a fully discharged state. The second target remaining capacity SOCstart is an initial remaining capacity 30% corresponding to the battery b, and an identifier of the battery b is stored, so that when a remaining capacity corresponding to the electronic device at a moment is subsequently determined, a remaining capacity corresponding to the battery b at the moment is determined as the first target remaining capacity. When the remaining capacity corresponding to the battery b is 20% after the battery a is discharged for a period of time, the first target remaining capacity SOCstemp is 20%. When the initially displayed value UIstart of the electronic device is 50%, the scaling coefficient Ratio is 5/3. In this case, the remaining capacity corresponding to the electronic device is (20%−30%)*5/3+50%=33.3%. In this case, 33% may be displayed.

According to the foregoing method embodiment, when the electronic device includes only one coulomb counter chip, full charge capacities and remaining capacities respectively corresponding to the two batteries can be effectively tracked, and after the remaining capacities respectively corresponding to the two batteries are obtained, the remaining capacities are fitted to obtain one remaining capacity, and then the remaining capacity is displayed on the electronic device, so that a user can intuitively learn of the overall remaining capacity of the electronic device.

To facilitate understanding of a process of determining a full charge capacity of the first battery, the following describes, by using discharge as an example, a method for obtaining a full charge capacity of the first battery.

Figure 6:
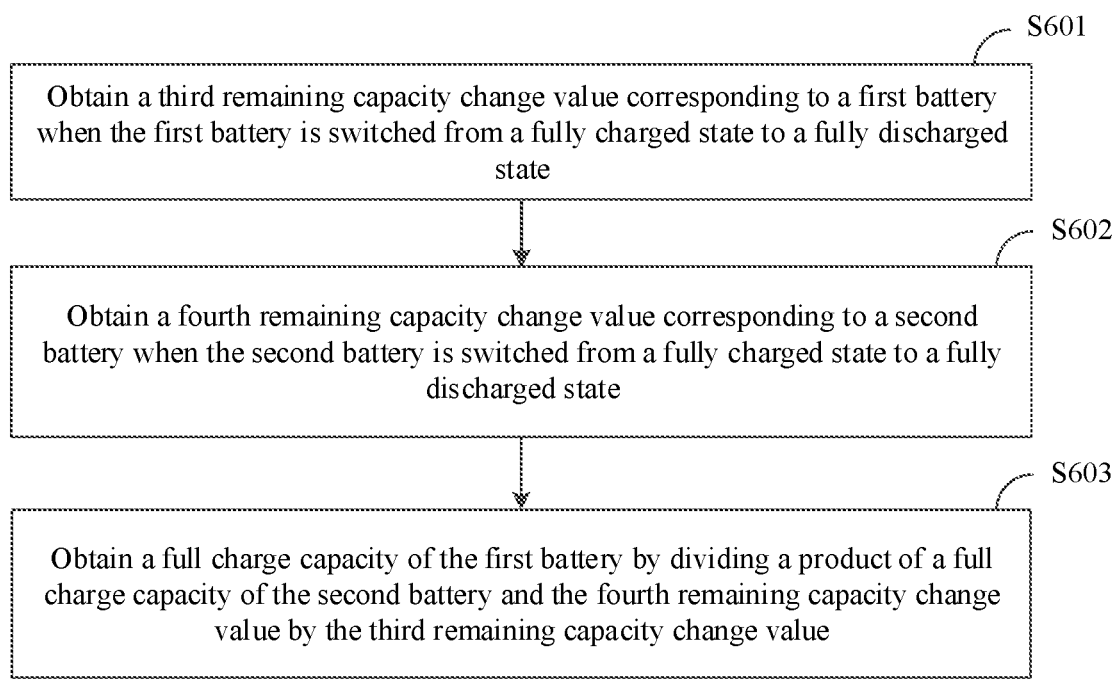
FIG. 6 is a flowchart of another battery capacity tracking method according to an embodiment of this application.

FIG. 6 is a flowchart of another battery capacity tracking method according to an embodiment of this application. The method is applied to an electronic device, the electronic device includes a coulomb counter chip, and a first battery and a second battery that are connected in series, the coulomb counter chip is connected to two ends of the second battery in parallel, and the method includes the following operations.

S601: Obtain a third remaining capacity change value corresponding to the first battery when the first battery is switched from a fully charged state to a fully discharged state.

S602: Obtain a fourth remaining capacity change value corresponding to the second battery when the second battery is switched from a fully charged state to a fully discharged state.

In other words, the third remaining capacity change value corresponding to the first battery when the first battery starts to be discharged from the fully charged state to the fully discharged state and the fourth remaining capacity change value corresponding to the second battery when the second battery starts to be discharged from the fully charged state to the fully discharged state are obtained.

It can be understood that, because the coulomb counter chip is connected to two ends of the second battery in parallel, the fourth remaining capacity change value corresponding to the second battery from the fully charged state to the fully discharged state may be directly obtained. For the first battery, this embodiment provides a method for obtaining the third remaining capacity change value. Specifically, when the first battery is in the fully charged state, a third open-circuit voltage of the first battery is obtained, and a third remaining capacity corresponding to the first battery is determined based on the third open-circuit voltage; when the first battery is in the fully discharged state, a fourth open-circuit voltage corresponding to the first battery is obtained, and a fourth remaining capacity corresponding to the first battery is determined based on the fourth open-circuit voltage; and a difference between the third remaining capacity and the fourth remaining capacity is determined as a third remaining capacity change value. In other words, a remaining capacity corresponding to the first battery in the fully charged state and a remaining capacity corresponding to the first battery in the fully discharged state are separately obtained, and the remaining capacity corresponding to the first battery in the fully discharged state is subtracted from the remaining capacity corresponding to the first battery in the fully charged state, to obtain the third remaining capacity change value corresponding to the first battery when the first battery is switched from the fully charged state to the fully discharged state. For a specific calculation process, refer to the method embodiment 3. Details are not described herein again in this embodiment.

S603: Obtain a full charge capacity of the first battery by dividing a product of a full charge capacity of the second battery and the fourth remaining capacity change value by the third remaining capacity change value.

It can be understood that, in a discharging process, if the first battery and the second battery are discharged simultaneously, and there is an equal quantity of currents and same battery duration, a quantity of charges flowing through the first battery is equal to a quantity of charges flowing through the second battery. Therefore, the full charge capacity of the second battery may be multiplied by the fourth remaining capacity change value, to obtain the quantity of charges flowing through the second battery in the discharging process, and then the quantity of charges flowing through the second battery in the discharging process is divided by the third remaining capacity change value, to obtain the full charge capacity of the first battery.

It should be noted that, for obtaining of each parameter in this embodiment, refer to the foregoing method embodiments. Details are not described herein again in this embodiment.

Example Apparatus

Based on the foregoing method embodiments, an embodiment of this application provides a battery capacity tracking apparatus. The following describes the apparatus with reference to the accompanying drawings.

Figure 7:
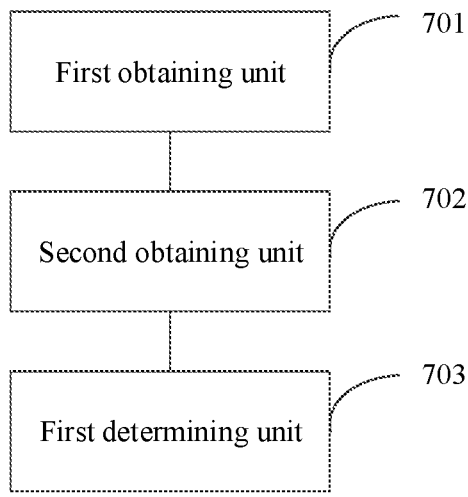
FIG. 7 is a diagram of a structure of a battery capacity tracking apparatus according to an embodiment of this application.

FIG. 7 is a diagram of a structure of a battery capacity tracking apparatus according to an embodiment of this application. As shown in FIG. 7, the apparatus may include:

a first obtaining unit 701, configured to obtain a first remaining capacity change value corresponding to a first battery when the first battery is switched between a fully charged state and a fully discharged state;

a second obtaining unit 702, configured to obtain a second remaining capacity change value corresponding to a second battery when the second battery is switched between a fully charged state and a fully discharged state; and a first determining unit 703, configured to determine a full charge capacity of the first battery based on the first remaining capacity change value, the second remaining capacity change value, and a full charge capacity of the second battery, where the full charge capacity of the second battery is directly obtained by using a coulomb counter chip.

In an embodiment, the first determining unit is configured to obtain the full charge capacity of the first battery by dividing a product of the full charge capacity of the second battery and the second remaining capacity change value by the first remaining capacity change value.

In an embodiment, during switching from the fully discharged state to the fully charged state, the first determining unit includes:

a first determining subunit, configured to determine a first additional capacity correspondingly consumed when a first switch is in a closed state in a charging process, where the first switch is connected to two ends of the first battery in parallel;

a second determining subunit, configured to determine a second additional capacity correspondingly consumed when a second switch is in a closed state in the charging process, where the second switch is connected to the two ends of the second battery in parallel; and a first calculation subunit, configured to obtain the full charge capacity of the first battery by dividing, by the first remaining capacity change value, a difference obtained by subtracting the first additional capacity from a sum of the second additional capacity and the product of the full charge capacity of the second battery and the second remaining capacity change value.

In an embodiment, the first obtaining unit includes:

a first obtaining subunit, configured to: when the first battery is in one state in the fully charged state or the fully discharged state, obtain a first open-circuit voltage of the first battery, and determine, based on the first open-circuit voltage, a first remaining capacity corresponding to the first battery;

a second obtaining subunit, configured to: when the first battery is in the other state in the fully charged state or the fully discharged state, obtain a second open-circuit voltage corresponding to the first battery, and determine, based on the second open-circuit voltage, a second remaining capacity corresponding to the first battery; and a third determining subunit, configured to determine a difference between the first remaining capacity and the second remaining capacity as the first remaining capacity change value.

In an embodiment, during switching from the fully charged state to the fully discharged state, the second obtaining subunit is configured to obtain, in a preset period, a first voltage of the first battery, a second voltage of the second battery, a first temperature of the first battery, a second temperature of the second battery, and a discharge current corresponding to the first battery in a discharging process; and when either the first voltage or the second voltage is less than a preset voltage threshold, both the first temperature and the second temperature meet a preset temperature, and the discharge current is less than a preset current threshold, the first determining unit 703 is configured to determine the second open-circuit voltage based on the first voltage, the discharge current, and circuit impedance, where the circuit impedance includes discharge line impedance, internal resistance of the first battery, and internal resistance of the second battery.

In an embodiment, the apparatus further includes:
a third obtaining unit, configured to obtain an initial remaining capacity corresponding to the first battery at an initial moment;
a second determining unit, configured to determine a remaining capacity change value that is of the second battery and that exists from the initial moment to a current moment;
a fourth obtaining unit, configured to obtain a remaining capacity change value of the first battery by dividing a product of the remaining capacity change value corresponding to the second battery and the full charge capacity of the second battery by the full charge capacity of the first battery;
a third determining unit, configured to determine, based on the initial remaining capacity and the remaining capacity change value of the first battery, a remaining capacity that is of the first battery and that exists at the current moment; and
a fourth determining unit, configured to determine a remaining capacity of an electronic device based on the remaining capacity of the first battery and a remaining capacity of the second battery.

In an embodiment, the fourth determining unit includes:
a fourth determining subunit, configured to determine, as a first target remaining capacity, a remaining capacity corresponding to a battery whose remaining capacity changes in the first battery and the second battery; and
a second calculation subunit, configured to determine, as a remaining capacity that is of the electronic device and that exists at the current moment, a sum of an initially displayed value and a product of a scaling coefficient and a difference between the first target remaining capacity and a second target remaining capacity, where the initially displayed value is a remaining capacity displayed by the electronic device before the remaining capacity changes.

In an embodiment, the apparatus further includes:
a fifth determining unit, configured to: during switching from the fully discharged state to the fully charged state, determine, as the second target remaining capacity, an initial remaining capacity corresponding to a battery that first enters a fully charged state; and
a first calculation unit, configured to determine, as the scaling coefficient, a ratio of a difference obtained by subtracting the initially displayed value from a maximum remaining capacity to a difference obtained by subtracting the second target remaining capacity from the maximum remaining capacity; or
a sixth determining unit, configured to: during switching from the fully charged state to the fully discharged state, determine, as the second target remaining capacity, an initial remaining capacity corresponding to a battery that first enters a fully discharged state; and
a second calculation unit, configured to determine a ratio of the initially displayed value to the second target remaining capacity as the scaling coefficient.

In an embodiment, the apparatus further includes:
a fifth obtaining unit, configured to obtain a third additional capacity correspondingly consumed when a first switch is in a closed state from the initial moment to the current moment, where the first switch is connected to two ends of the first battery in parallel; and
a sixth obtaining unit, configured to obtain a fourth additional capacity correspondingly consumed when a second switch is in a closed state from the initial moment to the current moment, where the second switch is connected to two ends of the second battery in parallel.

The fourth obtaining unit is configured to obtain the remaining capacity change value of the first battery by dividing, by the full charge capacity of the first battery, a difference obtained by subtracting the third additional capacity from a sum of the fourth additional capacity and the product of the remaining capacity change value of the second battery and the full charge capacity of the second battery.

In an embodiment, the third obtaining unit includes:
a third obtaining subunit, configured to obtain a first initial voltage that is of the first battery and that exists at the initial moment and a second initial voltage that is of the second battery and that exists at the initial moment;
a fifth determining subunit, configured to determine an open-circuit voltage of the second battery based on a remaining capacity corresponding to the second battery at the initial moment; and
a sixth determining subunit, configured to: obtain an open-circuit voltage of the first battery by subtracting the second initial voltage from a sum of the open-circuit voltage of the second battery and the first initial voltage, and determine the initial remaining capacity of the first battery based on the open-circuit voltage of the first battery.

Figure 8:
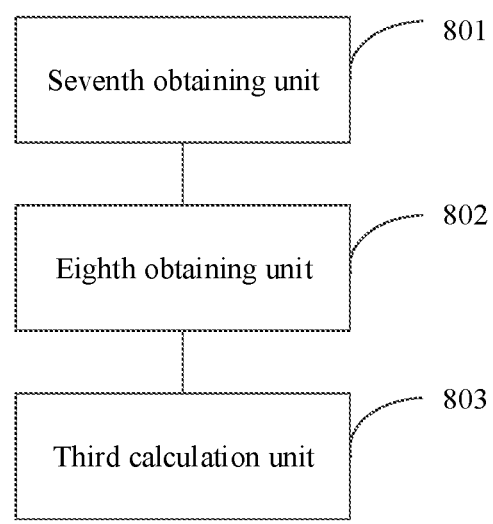
FIG. 8 is a diagram of a structure of another battery capacity tracking apparatus according to an embodiment of this application.

FIG. 8 is a diagram of a structure of another battery capacity tracking apparatus according to an embodiment of this application. The apparatus is applied to an electronic device, the electronic device includes a coulomb counter chip, and a first battery and a second battery that are connected in series, the coulomb counter chip is connected to two ends of the second battery in parallel, and the apparatus includes:
a seventh obtaining unit 801, configured to obtain a third remaining capacity change value corresponding to the first battery when the first battery is switched from a fully charged state to a fully discharged state;
an eighth obtaining unit 802, configured to obtain a fourth remaining capacity change value corresponding to the second battery when the second battery is switched from a fully charged state to a fully discharged state; and
a third calculation unit 803, configured to obtain a full charge capacity of the first battery by dividing a product of a full charge capacity of the second battery and the fourth remaining capacity change value by the third remaining capacity change value.

In an embodiment, the seventh obtaining unit includes:
a seventh determining subunit, configured to: when the first battery is in the fully charged state, obtain a third open-circuit voltage of the first battery, and determine, based on the third open-circuit voltage, a third remaining capacity corresponding to the first battery;
an eighth determining subunit, configured to: when the first battery is in the fully discharged state, obtain a fourth open-circuit voltage corresponding to the first battery, and determine, based on the fourth open-circuit voltage, a fourth remaining capacity corresponding to the first battery; and a ninth determining subunit, configured to determine a difference between the third remaining capacity and the fourth remaining capacity as the third remaining capacity change value.

It should be noted that, for an implementation of each unit in this embodiment, refer to the foregoing method embodiments. This is not limited herein in this embodiment.

In addition, an embodiment of this application further provides an electronic device. The following describes the electronic device with reference to the accompanying drawings.

FIG. 2B is a diagram of a structure of an electronic device according to an embodiment of this application. As shown in FIG. 2B, the electronic device includes a first battery 901, a second battery 902, a controller 903, a coulomb counter chip 904, and a charging integrated circuit 905.

The first battery 901 and the second battery 902 are connected in series, to supply power to the electronic device. The first battery 901 is a battery a, and the second battery 902 is a battery b.

An input end of the charging integrated circuit 905 is connected to a charging adapter, an output end of the charging integrated circuit is configured to be connected to a positive electrode of the first battery 901, a negative electrode of the first battery 901 is connected to a positive electrode of the second battery 902, and a negative electrode of the second battery 902 is grounded by using a resistor. The charging integrated circuit 905 is configured to charge the first battery 901 and the second battery 902. The charging integrated circuit (IC) may be referred to as a charging IC for short.

The coulomb counter chip 904 is connected to the second battery 902 in parallel, and is configured to: monitor a remaining capacity and a full charge capacity of the second battery 902, and send the remaining capacity and the full charge capacity to the controller 903.

The controller 903 is configured to: obtain a first remaining capacity change value corresponding to the first battery when the first battery is switched between a fully charged state and a fully discharged state; obtain a second remaining capacity change value corresponding to the second battery when the second battery is switched between a fully charged state and a fully discharged state; and determine a full charge capacity of the first battery based on the first remaining capacity change value, the second remaining capacity change value, and the full charge capacity of the second battery, where the full charge capacity of the second battery is directly obtained by using a coulomb counter chip of a coulometric sensor.

In an embodiment, the electronic device further includes a first switch 906 and a second switch 907.

The first switch 906 and a resistor Rbal are connected in series and are connected to two ends of the first battery 901 in parallel, and the second switch 907 and a resistor are connected in series and are connected to two ends of the second battery 902 in parallel. The first switch 906 is a switch A, and the second switch 907 is a switch B.

The controller is configured to: when a difference between a voltage of the first battery and a voltage of the second battery is greater than a first preset voltage in a charging process, close a switch connected to a battery with a large voltage value in parallel.

The first switch 906 and the second switch 907 are voltage equalization control apparatuses of the two batteries, and a current bypass may be established, so that a battery with a low voltage performs charging.

In an embodiment, the electronic device further includes an analog to digital converter 908.

The analog to digital converter 908 is connected to the first battery 901 in parallel, and is configured to: collect the voltage of the first battery 901, convert a collected analog voltage into a digital voltage, and send the digital voltage to the controller.

In an embodiment, the controller is configured to obtain the full charge capacity of the first battery by dividing a product of the full charge capacity of the second battery and the second remaining capacity change value by the first remaining capacity change value.

In an embodiment, during switching from the fully discharged state to the fully charged state, the controller is further configured to: determine a first additional capacity correspondingly consumed when the first switch is in a closed state in the charging process, where the first switch is connected to the two ends of the first battery in parallel; determine a second additional capacity correspondingly consumed when the second switch is in a closed state in the charging process, where the second switch is connected to the two ends of the second battery in parallel; and obtain the full charge capacity of the first battery by dividing, by the first remaining capacity change value, a difference obtained by subtracting the first additional capacity from a sum of the second additional capacity and the product of the full charge capacity of the second battery and the second remaining capacity change value.

In an embodiment, the controller is configured to: when the first battery is in one state in the fully charged state or the fully discharged state, obtain a first open-circuit voltage of the first battery, and determine, based on the first open-circuit voltage, a first remaining capacity corresponding to the first battery; when the first battery is in the other state in the fully charged state or the fully discharged state, obtain a second open-circuit voltage corresponding to the first battery, and determine, based on the second open-circuit voltage, a second remaining capacity corresponding to the first battery; and determine a difference between the first remaining capacity and the second remaining capacity as the first remaining capacity change value.

In an embodiment, during switching from the fully charged state to the fully discharged state, the controller is further configured to: obtain, in a preset period, a first voltage of the first battery, a second voltage of the second battery, a first temperature of the first battery, a second temperature of the second battery, and a discharge current corresponding to the first battery in a discharging process; and when either the first voltage or the second voltage is less than a preset voltage threshold, both the first temperature and the second temperature meet a preset temperature, and the discharge current is less than a preset current threshold, determine the second open-circuit voltage based on the first voltage, the discharge current, and circuit impedance, where the circuit impedance includes discharge line impedance, internal resistance of the first battery, and internal resistance of the second battery.

In an embodiment, the controller is further configured to: obtain an initial remaining capacity corresponding to the first battery at an initial moment; determine a remaining capacity change value that is of the second battery and that exists from the initial moment to a current moment; obtain a remaining capacity change value of the first battery by dividing a product of the remaining capacity change value corresponding to the second battery and the full charge capacity of the second battery by the full charge capacity of the first battery; determine, based on the initial remaining capacity and the remaining capacity change value of the first battery, a remaining capacity that is of the first battery and that exists at the current moment; and determine a remaining capacity of the electronic device based on the remaining capacity of the first battery and a remaining capacity of the second battery.

In an embodiment, the controller is configured to: determine, as a first target remaining capacity, a remaining capacity corresponding to a battery whose remaining capacity changes in the first battery and the second battery; and determine, as a remaining capacity that is of the electronic device and that exists at the current moment, a sum of an initially displayed value and a product of a scaling coefficient and a difference between the first target remaining capacity and a second target remaining capacity, where the initially displayed value is a remaining capacity displayed by the electronic device before the remaining capacity changes.

In an embodiment, the controller is further configured to: during switching from the fully discharged state to the fully charged state, determine, as the second target remaining capacity, an initial remaining capacity corresponding to a battery that first enters a fully charged state; and determine, as the scaling coefficient, a ratio of a difference obtained by subtracting the initially displayed value from a maximum remaining capacity to a difference obtained by subtracting the second target remaining capacity from the maximum remaining capacity; or during switching from the fully charged state to the fully discharged state, determine, as the second target remaining capacity, an initial remaining capacity corresponding to a battery that first enters a fully discharged state; and determine a ratio of the initially displayed value to the second target remaining capacity as the scaling coefficient.

In an embodiment, the controller is further configured to: obtain a third additional capacity correspondingly consumed when a first switch is in a closed state from an initial moment to a current moment, where the first switch is connected to two ends of the first battery in parallel; and obtain a fourth additional capacity correspondingly consumed when a second switch is in a closed state from the initial moment to the current moment, where the second switch is connected to two ends of the second battery in parallel; and the controller is configured to obtain the remaining capacity change value of the first battery by dividing, by the full charge capacity of the first battery, a difference obtained by subtracting the third additional capacity from a sum of the fourth additional capacity and a product of the remaining capacity change value of the second battery and the full charge capacity of the second battery.

In an embodiment, the controller is configured to: obtain a first initial voltage that is of the first battery and that exists at an initial moment and a second initial voltage that is of the second battery and that exists at the initial moment; determine an open-circuit voltage of the second battery based on a remaining capacity corresponding to the second battery at the initial moment; and obtain an open-circuit voltage of the first battery by subtracting the second initial voltage from a sum of the open-circuit voltage of the second battery and the first initial voltage, and determine an initial remaining capacity of the first battery based on the open-circuit voltage of the first battery.

It should be noted that, for a specific implementation of each module in this embodiment, refer to the foregoing method embodiments. This is not limited herein in this embodiment.

It should be understood that, in this application, "at least one" means one or more, and "a plurality of" means two or more. The term "and/or" is used to describe an association relationship between associated objects, and indicates that three relationships may exist. For example, "A and/or B" may indicate the following three cases: Only A exists, only B exists, and both A and B exist, where A and B may be singular or plural. The character "/" generally represents an "or" relationship between the associated objects. "At least one of the following items (pieces)" or a similar expression thereof indicates any combination of these items, including a single item (piece) or any combination of a plurality of items (pieces). For example, at least one (piece) of a, b, or c may represent: a, b, c, "a and b", "a and c", "b and c", or "a, b, and c", where a, b, and c may be singular or plural.

It should be noted that in this specification, relational terms such as first and second are only used to distinguish one entity or operation from another, and do not necessarily require or imply that any actual relationship or sequence exists between these entities or operations. In addition, terms "include" and "have" and any variants thereof are intended to cover a non-exclusive inclusion, so that a process, a method, an article, or a device that includes a list of elements not only includes those elements but also includes other elements that are not expressly listed, or further includes elements inherent to such a process, method, article, or device. An element preceded by "includes a . . . " does not, without more constraints, preclude the presence of additional identical elements in the process, method, article, or device that includes the element.

The operations in the method or algorithm described in embodiments disclosed in this specification may be implemented directly by hardware, software module executed by the processor, or a combination of hardware and a software module. The software module may be configured in a random access memory (RAM), a memory, a read-only memory (ROM), an electrically programmable ROM, an electrically erasable programmable ROM, a register, a hard disk, a removable disk, a CD-ROM, or a storage medium in any other forms well-known in the art.

The embodiments disclosed above are described to enable a person skilled in the art to implement or use this application. Various modifications to the embodiments are obvious to the person skilled in the art, and general principles defined in this specification may be implemented in other embodiments without departing from the scope of this application. Therefore, this application is not limited to the embodiments described in this specification but extends to the widest scope that complies with the principles and novelty disclosed in this specification.

The invention claimed is:

1. A method for tracking battery capacity of an electronic device, the method comprising:
  obtaining a first remaining capacity change value of a first battery of the electronic device when the first battery is switched between a fully charged state and a fully discharged state;
  obtaining a second remaining capacity change value of a second battery of the electronic device when the second battery is switched between a fully charged state and a fully discharged state; and
  determining a full charge capacity of the first battery based on the first remaining capacity change value, the second remaining capacity change value, and a full charge capacity of the second battery, wherein the full charge capacity of the second battery is directly obtained by using a coulomb counter chip connected to the second battery in parallel.

2. The method according to claim 1, wherein the determining a full charge capacity of the first battery based on the first remaining capacity change value, the second remaining capacity change value, and a full charge capacity of the second battery comprises:
obtaining the full charge capacity of the first battery by dividing a product of the full charge capacity of the second battery and the second remaining capacity change value by the first remaining capacity change value.

3. The method according to claim 2, wherein during switching from the fully discharged state to the fully charged state, obtaining the full charge capacity of the first battery further comprises:
determining a first additional capacity consumed when a first switch is in a closed state in a charging process, wherein the first switch is connected to the first battery in parallel;
determining a second additional capacity consumed when a second switch is in a closed state in the charging process, wherein the second switch is connected to the second battery in parallel; and
obtaining the full charge capacity of the first battery by dividing, by the first remaining capacity change value, a difference obtained by subtracting the first additional capacity from a sum of the second additional capacity and the product of the full charge capacity of the second battery and the second remaining capacity change value.

4. The method according to claim 1, wherein the obtaining a first remaining capacity change value of the first battery when the first battery is switched between a fully charged state and a fully discharged state comprises:
when the first battery is in one state in the fully charged state or the fully discharged state, obtaining a first open-circuit voltage of the first battery, and determining a first remaining capacity of the first battery based on the first open-circuit voltage;
when the first battery is in the other state in the fully charged state or the fully discharged state, obtaining a second open-circuit voltage of the first battery, and determining a second remaining capacity of the first battery based on the second open-circuit voltage; and
determining a difference between the first remaining capacity and the second remaining capacity as the first remaining capacity change value.

5. The method according to claim 4, wherein during switching from the fully charged state to the fully discharged state, obtaining the second open-circuit voltage of the first battery comprises:
obtaining, in a preset period, a first voltage of the first battery, a second voltage of the second battery, a first temperature of the first battery, a second temperature of the second battery, and a discharge current corresponding to the first battery in a discharging process; and
when either the first voltage or the second voltage is less than a preset voltage threshold, both the first temperature and the second temperature meet a preset temperature, and the discharge current is less than a preset current threshold, determining the second open-circuit voltage based on the first voltage, the discharge current, and circuit impedance that includes discharge line impedance, internal resistance of the first battery, and internal resistance of the second battery.

6. The method according to claim 1, further comprising:
obtaining an initial remaining capacity of the first battery at an initial moment;
determining a remaining capacity change value of the second battery that exists from the initial moment to a current moment;
obtaining a remaining capacity change value of the first battery by dividing a product of the remaining capacity change value of the second battery and the full charge capacity of the second battery by the full charge capacity of the first battery;
determining a remaining capacity of the first battery that exists at the current moment based on the initial remaining capacity and the remaining capacity change value of the first battery; and
determining a remaining capacity of the electronic device based on the remaining capacity of the first battery and a remaining capacity of the second battery.

7. The method according to claim 6, wherein the determining a remaining capacity of the electronic device based on the remaining capacity of the first battery and a remaining capacity of the second battery comprises:
determining, as a first target remaining capacity, a remaining capacity of a battery whose remaining capacity changes in the first battery and the second battery; and
determining, as a remaining capacity of the electronic device that exists at the current moment, a sum of an initially displayed value and a product of a scaling coefficient and a difference between the first target remaining capacity and a second target remaining capacity, wherein the initially displayed value represents a remaining capacity displayed by the electronic device before the remaining capacity changes.

8. The method according to claim 7, further comprising:
during switching from the fully discharged state to the fully charged state, determining, as the second target remaining capacity, an initial remaining capacity of a battery that first enters a fully charged state; and
determining, as the scaling coefficient, a ratio of a difference obtained by subtracting the initially displayed value from a maximum remaining capacity to a difference obtained by subtracting the second target remaining capacity from the maximum remaining capacity; or
during switching from the fully charged state to the fully discharged state, determining, as the second target remaining capacity, an initial remaining capacity of a battery that first enters a fully discharged state; and
determining a ratio of the initially displayed value to the second target remaining capacity as the scaling coefficient.

9. The method according to claim 6, wherein before obtaining the remaining capacity change value of the first battery, the method further comprises:
obtaining a third additional capacity consumed when a first switch is in a closed state from the initial moment to the current moment, wherein the first switch is connected to the first battery in parallel; and
obtaining a fourth additional capacity consumed when a second switch is in a closed state from the initial moment to the current moment, wherein the second switch is connected to the second battery in parallel; and
wherein obtaining the remaining capacity change value of the first battery comprises:
obtaining the remaining capacity change value of the first battery by dividing, by the full charge capacity of the first battery, a difference obtained by subtracting the third additional capacity from a sum of the fourth additional capacity and the product of the remaining capacity change value of the second battery and the full charge capacity of the second battery.

10. The method according to claim 6, wherein obtaining the initial remaining capacity of the first battery comprises:
   obtaining a first initial voltage of the first battery that exists at the initial moment and a second initial voltage of the second battery that exists at the initial moment;
   determining an open-circuit voltage of the second battery based on a remaining capacity of the second battery at the initial moment; and
   obtaining an open-circuit voltage of the first battery by subtracting the second initial voltage from a sum of the open-circuit voltage of the second battery and the first initial voltage, and determining the initial remaining capacity of the first battery based on the open-circuit voltage of the first battery.

11. A method for tracking battery capacity of an electronic device, the method comprising:
   obtaining a third remaining capacity change value of a first battery of the electronic device when the first battery is switched from a fully charged state to a fully discharged state;
   obtaining a fourth remaining capacity change value of a second battery of the electronic device when the second battery is switched from a fully charged state to a fully discharged state; and
   obtaining a full charge capacity of the first battery by dividing a product of a full charge capacity of the second battery and the fourth remaining capacity change value by the third remaining capacity change value.

12. The method according to claim 11, wherein the obtaining the third remaining capacity change value comprises:
   when the first battery is in the fully charged state, obtaining a third open-circuit voltage of the first battery, and determining a third remaining capacity corresponding to the first battery based on the third open-circuit voltage;
   when the first battery is in the fully discharged state, obtaining a fourth open-circuit voltage of the first battery, and determining a fourth remaining capacity of the first battery based on the fourth open-circuit voltage; and
   determining a difference between the third remaining capacity and the fourth remaining capacity as the third remaining capacity change value.

13. An electronic device, comprising:
   a first battery and a second battery connected in series to supply power to the electronic device;
   a charging integrated circuit having an input end configured to be connected to a charging adapter to charge the first battery and the second battery;
   a coulomb counter chip connected to the second battery in parallel, and configured to:
      monitor a remaining capacity and a full charge capacity of the second battery, and
      send the remaining capacity and the full charge capacity to the controller; and
   a controller configured to:
      obtain a first remaining capacity change value of the first battery when the first battery is switched between a fully charged state and a fully discharged state,
      obtain a second remaining capacity change value of the second battery when the second battery is switched between a fully charged state and a fully discharged state, and
      determine a full charge capacity of the first battery based on the first remaining capacity change value, the second remaining capacity change value, and the full charge capacity of the second battery.

14. The electronic device according to claim 13, further comprising:
   a first switch and a first resistor connected in series and connected to the first battery in parallel; and
   a second switch and a second resistor connected in series and connected to the second battery in parallel,
   wherein the controller is configured to when a difference between a voltage of the first battery and a voltage of the second battery is greater than a first preset voltage in a charging process, close a switch connected to a battery with a large voltage value in parallel.

15. The electronic device according to claim 13, further comprising:
   an analog to digital (A/D) converter connected to the first battery in parallel to collect the voltage of the first battery, convert a collected analog voltage into a digital voltage, and send the digital voltage to the controller.

16. The electronic device according to claim 13, wherein the controller is configured to obtain the full charge capacity of the first battery by dividing a product of the full charge capacity of the second battery and the second remaining capacity change value by the first remaining capacity change value.

17. The electronic device according to claim 14, wherein during switching from the fully discharged state to the fully charged state, the controller is further configured to:
   determine a first additional capacity correspondingly consumed when the first switch is in a closed state in the charging process, wherein the first switch is connected to the first battery in parallel;
   determine a second additional capacity correspondingly consumed when the second switch is in a closed state in the charging process, wherein the second switch is connected to the second battery in parallel; and
   obtain the full charge capacity of the first battery by dividing, by the first remaining capacity change value, a difference obtained by subtracting the first additional capacity from a sum of the second additional capacity and the product of the full charge capacity of the second battery and the second remaining capacity change value.

18. The electronic device according to claim 13, wherein the controller is configured to:
   when the first battery is in one state in the fully charged state or the fully discharged state, obtain a first open-circuit voltage of the first battery, and determine a first remaining capacity corresponding to the first battery based on the first open-circuit voltage;
   when the first battery is in the other state in the fully charged state or the fully discharged state, obtain a second open-circuit voltage corresponding to the first battery, and determine a second remaining capacity corresponding to the first battery based on the second open-circuit voltage; and
   determine a difference between the first remaining capacity and the second remaining capacity as the first remaining capacity change value.

19. The electronic device according to claim 18, wherein during switching from the fully charged state to the fully discharged state, the controller is further configured to:
  obtain, in a preset period, a first voltage of the first battery, a second voltage of the second battery, a first temperature of the first battery, a second temperature of the second battery, and a discharge current corresponding to the first battery in a discharging process; and
  when either the first voltage or the second voltage is less than a preset voltage threshold, both the first temperature and the second temperature meet a preset temperature, and the discharge current is less than a preset current threshold, determine the second open-circuit voltage based on the first voltage, the discharge current, and circuit impedance, wherein the circuit impedance comprises discharge line impedance, internal resistance of the first battery, and internal resistance of the second battery.

20. The electronic device according to claim 13, wherein the controller is further configured to:
  obtain an initial remaining capacity of the first battery at an initial moment;
  determine a remaining capacity change value of the second battery that exists from the initial moment to a current moment;
  obtain a remaining capacity change value of the first battery by dividing a product of the remaining capacity change value of the second battery and the full charge capacity of the second battery by the full charge capacity of the first battery;
  determine a remaining capacity of the first battery that exists at the current moment based on the initial remaining capacity and the remaining capacity change value of the first battery; and
  determine a remaining capacity of the electronic device based on the remaining capacity of the first battery and a remaining capacity of the second battery.

* * * * *